US009050798B2

(12) United States Patent
Yokoyama et al.

(10) Patent No.: US 9,050,798 B2
(45) Date of Patent: Jun. 9, 2015

(54) INK-JET HEAD AND MANUFACTURING METHOD OF THE SAME

(71) Applicant: Toshiba Tec Kabushiki Kaisha, Tokyo (JP)

(72) Inventors: Shuhei Yokoyama, Shizuoka (JP); Ryutaro Kusunoki, Shizuoka (JP); Chiaki Tanuma, Tokyo (JP); Ryuichi Arai, Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/786,311

(22) Filed: Mar. 5, 2013

(65) Prior Publication Data

US 2013/0235123 A1    Sep. 12, 2013

(30) Foreign Application Priority Data

Mar. 6, 2012 (JP) ................................. 2012-049415

(51) Int. Cl.
*B41J 2/05*    (2006.01)
*B41J 2/14*    (2006.01)
(Continued)

(52) U.S. Cl.
CPC .............. *B41J 2/14201* (2013.01); *H01L 41/22* (2013.01); *Y10T 29/42* (2015.01); *B41J 2/161* (2013.01); *B41J 2/14233* (2013.01); *B41J 2/1623* (2013.01); *B41J 2/1628* (2013.01); *B41J 2/1631* (2013.01); *B41J 2/1632* (2013.01);
(Continued)

(58) Field of Classification Search
CPC ........ B41J 2/015; B41J 2/161; B41J 2/14233; B41J 2/1646; B41J 2002/1437; Y02T 29/42
USPC ................................. 347/70; 216/27
See application file for complete search history.

(56) References Cited

U.S. PATENT DOCUMENTS

| 4,087,584 A | * | 5/1978 | Taniguchi et al. ............ 428/422 |
| 5,790,151 A | * | 8/1998 | Mills ............................... 347/47 |
| 6,568,794 B2 | * | 5/2003 | Yamanaka et al. .............. 347/54 |

(Continued)

FOREIGN PATENT DOCUMENTS

| JP | 10-058672 | * | 3/1998 | ............... B41J 2/015 |
| JP | H10-58672 | * | 3/1998 | |

(Continued)

OTHER PUBLICATIONS

Office Action dated Jan. 16, 2014, filed in Japanese Patent Application No. 2012-049415, English translation.*

(Continued)

*Primary Examiner* — Alessandro Amari
*Assistant Examiner* — Michael Konczal
(74) *Attorney, Agent, or Firm* — Patterson & Sheridan, LLP

(57) ABSTRACT

According to embodiments, a manufacturing method for an ink-jet head is disclosed. The method comprises forming an ink pressure chamber, forming an oscillating plate, and forming, on the oscillating plate, a first electrode having a predetermined footprint. The method further comprises forming, on the oscillating plate and on the first electrode, a piezoelectric film having a footprint that is geometrically similar to the predetermined footprint, forming, on the oscillating plate and the piezoelectric film, a second electrode having a footprint that is geometrically similar to the predetermined footprint, and forming a nozzle in the oscillating plate.

9 Claims, 19 Drawing Sheets

(51) Int. Cl.
*H01L 41/22* (2013.01)
*B41J 2/16* (2006.01)

(52) U.S. Cl.
CPC ............. *B41J 2/1642* (2013.01); *B41J 2/1643* (2013.01); *B41J 2/1646* (2013.01); *B41J 2002/1437* (2013.01)

(56) References Cited

U.S. PATENT DOCUMENTS 7,270,403 B2 * 9/2007 Sanada ........................... 347/68
7,843,113 B2 * 11/2010 Wijngaards et al. .......... 310/320
2009/0102907 A1 * 4/2009 Yamanaka et al. .............. 347/94
2009/0237468 A1 * 9/2009 Kanemoto ...................... 347/70
2012/0056947 A1 * 3/2012 Tanuma et al. ................. 347/71

FOREIGN PATENT DOCUMENTS

| JP | 2000-289201 | | | 10/2000 |
| JP | 2000289201 | A | * | 10/2000 |
| JP | 2012049415 | A | * | 3/2012 |

OTHER PUBLICATIONS

Office Action dated Jan. 16, 2014, filed in Japanese Patent Application No. 2012-049415, with English translation.

* cited by examiner

US 9,050,798 B2

INK-JET HEAD AND MANUFACTURING METHOD OF THE SAME

CROSS-REFERENCE TO RELATED APPLICATION

This application is based upon and claims the benefit of priority from Japanese Patent Application No. 2012-049415, filed Mar. 6, 2012; the entire contents of which are incorporated herein by reference.

FIELD

Embodiments described herein relate to an ink-jet head that forms images by discharging ink from a nozzle and a manufacturing method for the ink-jet head.

BACKGROUND

A known on-demand type of ink-jet printing method forms an image from ink drops on recording paper by discharging ink drops from a nozzle according to image signals. The primary on-demand type ink-jet recording methods are the heater element type and the piezo element type. The heater element type is configured to generate air bubbles inside the ink by energizing heater elements in the ink fluid channel, so that the ink that is pushed by the air bubbles is discharged from a nozzle. The piezo element type is configured so that ink that is present in an ink chamber is discharged from a nozzle utilizing the deformation of a piezo element.

A piezo element is an element that converts voltage into force. When an electrical field is applied to this piezo element, tension or shearing deformation is caused. As a representative piezo element, lead zirconium titanate can be used.

A known configuration of an ink-jet head uses a nozzle substrate that is formed from piezoelectric materials. In this ink-jet head, electrodes are formed on both sides of the nozzle substrate surrounding a nozzle. The ink flows in between the nozzle substrate and a substrate that supports the nozzle substrate. The ink forms a meniscus inside of the nozzle. A drive waveform that oscillates piezo elements is applied to electrodes on the nozzle substrate. By the piezo elements oscillating, supersonic oscillation is generated inside of the nozzle, and the ink inside the meniscus is discharged. The ink-jet head is configured so that, when the piezo elements on the nozzle substrate are excited, the oscillation energy is concentrated in the direction from the peripheral parts of the ink droplet discharge opening to the center. The ink drop is discharged in a direction that is perpendicular to the ink surface.

It is difficult to precisely and cheaply form multiple nozzles on piezo elements, which are ceramic. Formation of the nozzles on piezo elements requires expensive processing costs.

DETAILED DESCRIPTION

Figure 1:
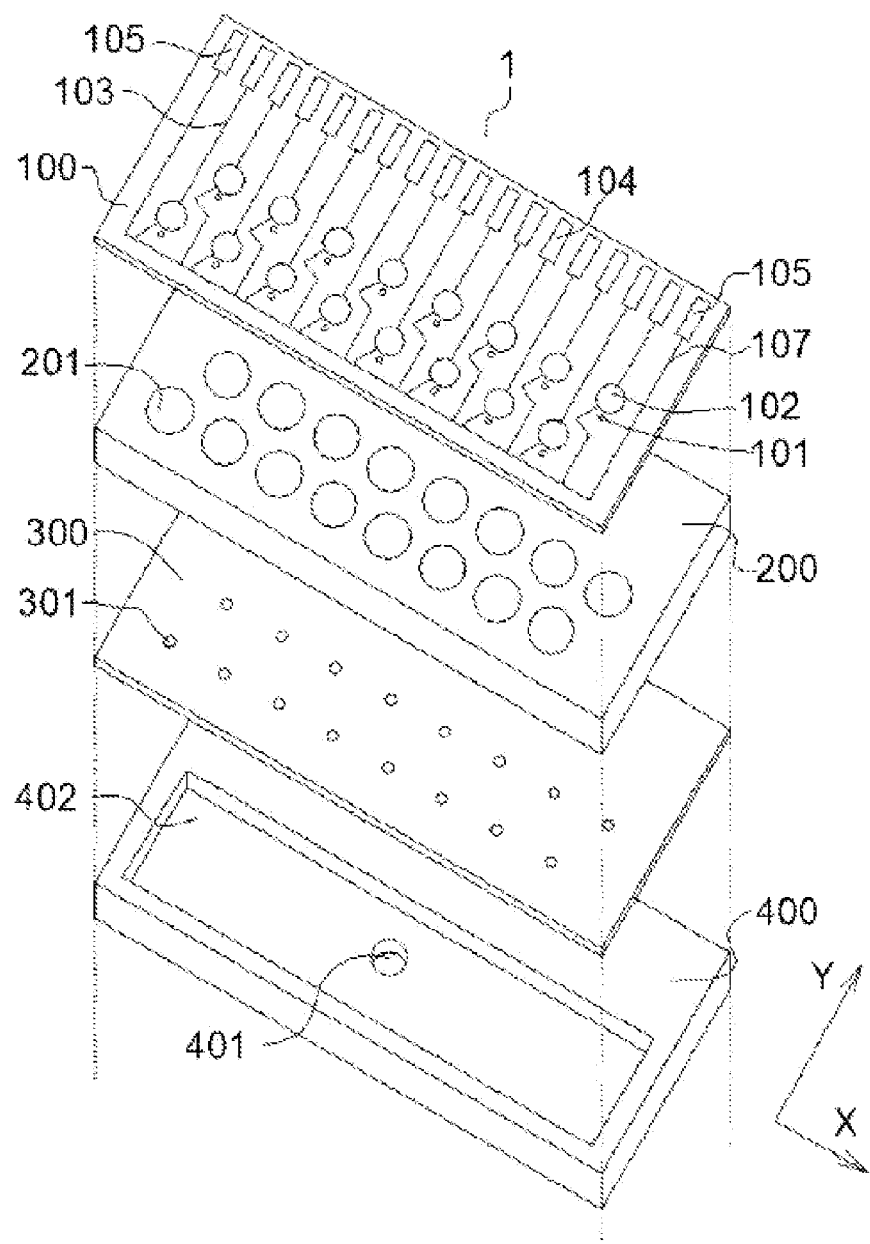
FIG. 1 is an exploded perspective view of an ink-jet head, according to a first embodiment.

According to embodiments, an ink-jet head is disclosed. The ink-jet head comprises an oscillating plate, a nozzle configured to discharge ink and installed on the oscillating plate, and an ink pressure chamber in fluid communication with the nozzle and disposed on a first surface of the oscillating plate. The ink-jet head further comprises a first electrode disposed on a second surface of the oscillating plate, the first electrode having a predetermined footprint, and a piezoelectric film disposed on the first electrode in a position that is different from the nozzle and configured to expand or contract the ink pressure chamber by deforming the oscillating plate in response to a driving signal, the piezoelectric film having a footprint that is geometrically similar to the predetermined footprint. The ink-jet head further comprises a second electrode that is formed on the piezoelectric film, the second electrode having a footprint that is geometrically similar to the predetermined footprint, wherein the first electrode and the second electrode are configured to provide the driving signal to the piezoelectric film, and an ink supply path configured to supply ink to the ink pressure chamber.

According to additional embodiments, a manufacturing method for an ink-jet head is disclosed. The method comprises forming an ink pressure chamber, forming an oscillating plate, and forming, on the oscillating plate, a first electrode having a predetermined footprint. The method further comprises forming, on the oscillating plate and on the first electrode, a piezoelectric film having a footprint that is geometrically similar to the predetermined footprint, forming, on the oscillating plate and the piezoelectric film, a second electrode having a footprint that is geometrically similar to the predetermined footprint, and forming a nozzle in the oscillating plate.

According to additional embodiments, manufacturing method for an ink-jet head is disclosed. The method comprises forming an ink pressure chamber, forming an oscillating plate, and forming, on the oscillating plate, a first electrode having a predetermined footprint. The method further comprises forming, on the oscillating plate and on the first electrode, a piezoelectric film having a footprint that is geometrically similar to the predetermined footprint, and forming, on the oscillating plate and the piezoelectric film, a second electrode having a footprint that is geometrically similar to the predetermined footprint. The method further comprises forming a protective film on the second electrode and the oscillating plate, forming a mask film on the protective film, the mask film including a nozzle pattern, forming a nozzle in the oscillating plate through the nozzle pattern, and removing the mask film.

In general, the embodiments are described below with reference to the figures. Additionally, the figures describing the present embodiments are described with different scales, when necessary, in order to describe the characteristic parts. For this reason, not all the figures are necessarily depicted with the correct scale.

The ink-jet head of an exemplary embodiment includes an oscillating plate; a nozzle that discharges ink that is installed on the oscillating plate; an ink pressure chamber that is communicated with the nozzle and is placed on one surface of the oscillating plate; a first electrode that is formed on the other surface of the oscillating plate; a piezoelectric film that is installed on the first electrode in a position that is different from the nozzle and that expands or contracts the ink pressure chamber by deforming the oscillating plate by a driving voltage; a second electrode that is formed on the piezoelectric film; and an ink supply method that supplies ink to the ink pressure chamber.

First Embodiment

FIG. 1 is an exploded perspective view of the ink-jet head to which the first embodiment is applied.

The ink-jet head 1 shown in FIG. 1 includes a nozzle plate 100, an ink pressure chamber structure 200, a separate plate 300, and an ink supply route structure 400.

The nozzle plate 100 has multiple nozzles 101 (i.e., the ink discharge holes) for discharging ink. The nozzles 101 penetrate the nozzle plate 100 in the thickness direction.

The ink pressure chamber structure 200 has multiple ink pressure chambers 201 that correspond to the multiple nozzles 101. Each ink pressure chamber 201 is connected to a corresponding nozzle 101.

The separate plate 300 has multiple ink inlets 301 (i.e., ink supply apertures to the ink pressure chamber). Each ink inlet 301 is connected to a corresponding ink pressure chamber 201 that is formed in the ink pressure chamber structure 200.

The ink pressure chamber 201 and the ink inlet 301 are arranged to correspond to the multiple nozzles 101. The multiple ink pressure chambers 201 are connected to an ink supply routes 402 via the ink inlet 301.

The ink pressure chamber 201 retains ink for forming images. The ink pressure chamber 201 has a cylinder shape and has a cross section that includes an actuator 102, mentioned below, and the nozzle 101. With the deformation of the nozzle plate 100, a pressure change is generated in the ink inside of each ink pressure chamber 201, and the ink is discharged from each nozzle 101. At this time, the separate plate 300 retains the pressure generated inside of the ink pressure chamber 201 and plays a roll preventing the pressure from escaping to the ink supply route 402. For this reason, the diameter of the ink inlet 301 is less than or equal to ¼ of the diameter of the ink pressure chamber 201.

The ink supply route 402 is in the ink supply route structure 400. The ink supply route structure 400 has an ink supply port 401 that supplies ink from the outside of the ink-jet head. The ink supply route 402 surrounds all of the multiple ink pressure chambers 201 so that the ink supply route can supply ink to all of the ink supply chambers 201.

The ink pressure chamber structure 200 is formed from a silicon wafer that is 725 μm thick. Each ink pressure chamber 201 is cylinder shaped with a diameter of 240 μm. The center of the circular nozzle 101 with a diameter of 20 μm and is in a position that is 93 μm from the center of the circle of each ink pressure chamber 201. Also, the ink pressure chamber 201 surrounds the nozzle 101 and the actuator 102.

The separate plate 300 is stainless steel with a thickness of 200 μm. The diameter of the ink inlet 301 may be 60 pa. The ink inlet 301 is configured so that the ink flow path resistance to each ink pressure chamber 201 will be nearly the same and so that the variability in the shape of the ink inlet 301 is suppressed.

Incidentally the ink inlet 301 can be removed if the diameter or depth of the ink pressure chamber 201 is adequately designed. Even if the separate plate 300 having the ink inlet 301 is not built into the inkjet head 1, ink drops can be discharged from the inkjet head 1.

The ink supply route structure 400 may be stainless steel and 4 mm thick. The ink supply route 402 may have a depth of 2 mm from the surface of the stainless steel. The ink supply port 401 is roughly in the center of the ink supply route 402. The ink supply port 401 is configured so that the ink flow path resistance to each ink pressure chamber 201 will be nearly the same.

Figure 2:
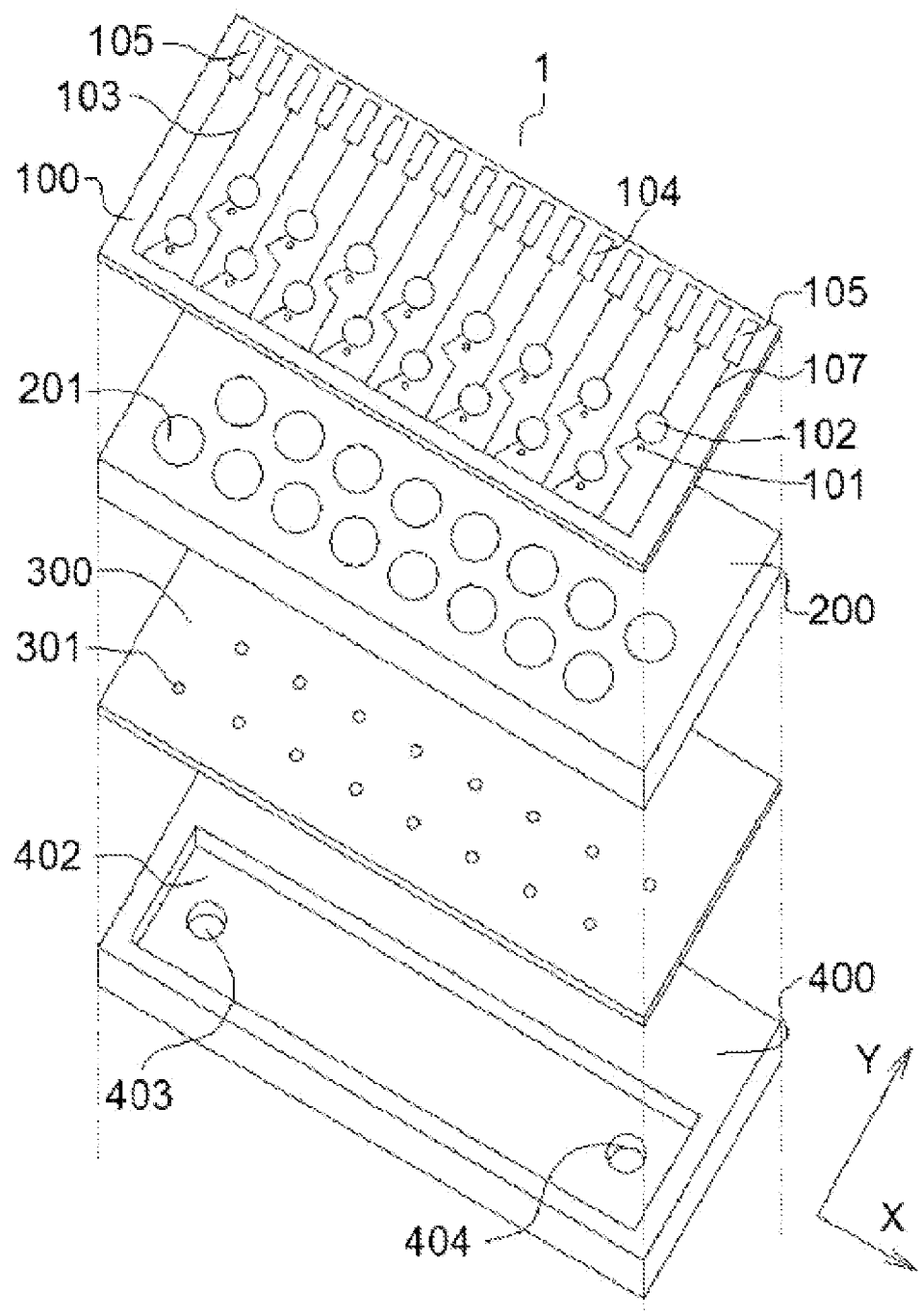
FIG. 2 is an exploded perspective view of the ink-jet head according to the first embodiment, showing a different ink supply path from that in FIG. 1.

FIG. 2, unlike FIG. 1, shows a configuration in which a circulating ink supply port 403 and a circulating ink discharge port 404 are positioned near opposite ends of the ink supply route 402, so that the ink will be circulated inside of the ink supply route 402.

By making the ink circulate, it is possible to maintain the ink temperature inside of the ink supply route 402 constant. Thus, compared to the ink-jet head in FIG. 1, it has a beneficial effect of suppressing the temperature increase in the ink caused by the heat that is generated by the deformation of the nozzle plate 100.

The nozzle plate 100 is an integral structure formed on the ink pressure chamber structure 200 by a film-forming process described below.

The ink pressure chamber structure 200, the separate plate 300, and the ink supply route structure 400 are fixed with epoxy cement so that the nozzle 101 and the ink pressure chamber 201 maintain a set positional relationship.

According to the embodiment disclosed, the ink pressure chamber structure 200 is formed from a silicon wafer, and the separate plate 300 and the ink supply route structure 400 are formed from stainless steel. However, the materials for these structures 200, 300, and 400 are not limited to silicon wafers and stainless steel. The structures 200, 300, and 400, taking into account the differences in the expansion coefficient of the nozzle plate 100, can be different materials as long as they do not affect the generation of the ink discharge pressure. For example, for the ceramic material, nitrides and oxides such as alumina ceramic, zirconia, silicon carbide, silicon nitride, and barium titanate may be used. It is also possible to use, as the resin material, plastic materials such as ABS (acrylicnitrile butadiene styrene), polyacetal, polyamide, polycarbonate, and polyether sulfone. It is also possible to use metal materials (alloys), with representative materials being aluminum, titanium, etc.

Figure 3:
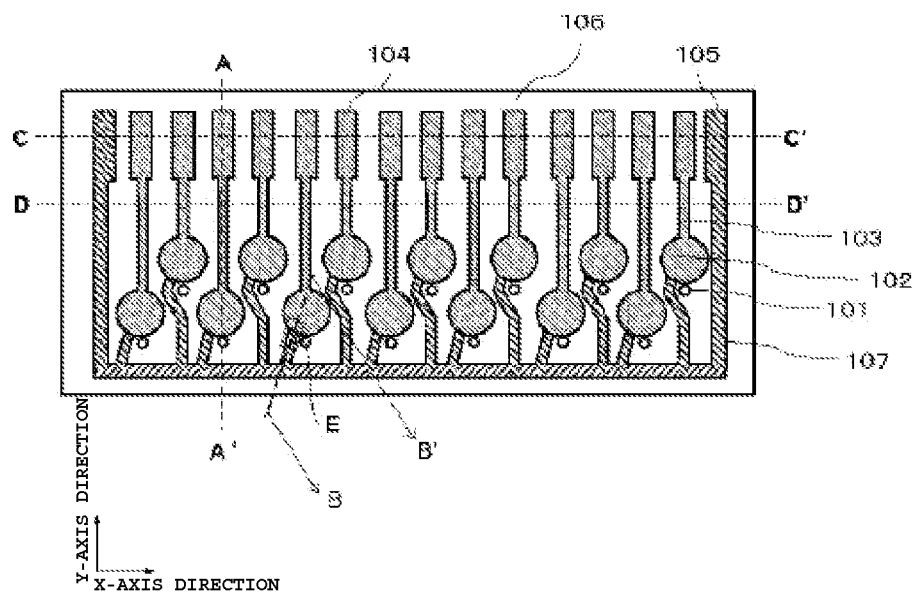
FIG. 3 is a plane view of the ink-jet head, illustrating a nozzle plate, according to the first embodiment.

The configuration of the nozzle plate 100 is described with reference to FIG. 3. FIG. 3 is a plane view diagram of the ink-jet head, specifically of the nozzle plate 100 seen from the ink discharge side.

The nozzle plate 100 includes nozzles 101 that discharge ink and actuators 102 that generate the pressure for discharging the ink out of the nozzle 101. Additionally, the nozzle plate 100 has wiring electrodes 103 that transmit signals for driving the actuators 102 and a common electrode 107. Furthermore, the nozzle plate 100 includes wiring electrode terminal parts 104, each of which is part of a corresponding wiring electrode 103 and each of which receives a signal that drives the ink-jet head 1 from the outside of the ink-jet head 1. The wiring electrode terminal parts 104 similarly include a common electrode terminal part 105, which is part of the common electrode 107, and which receives a signal that drives the ink-jet head 1.

The actuators 102, the wiring electrodes 103, the wiring electrode terminal parts 104, the common electrode 107, and the common electrode terminal part 105 are formed on the oscillating plate 106.

The nozzles 101 extend through the nozzle plate 100. The center of each nozzle 101 is positioned away from the circular cross-section center of the corresponding ink pressure chamber 201. Ink is provided from one ink pressure chamber 201 into the corresponding nozzle 101. The oscillating plate 106 is deformed by the movement of the actuator 102 that corresponds to the nozzle 101. Due to the pressure change that is generated in the ink pressure chamber 201, the ink that is supplied to the nozzle 101 is discharged. All nozzles 101 behave in the same way.

The nozzle 101 is cylindrically shaped, and may have a diameter of 20 µm.

Figure 12:
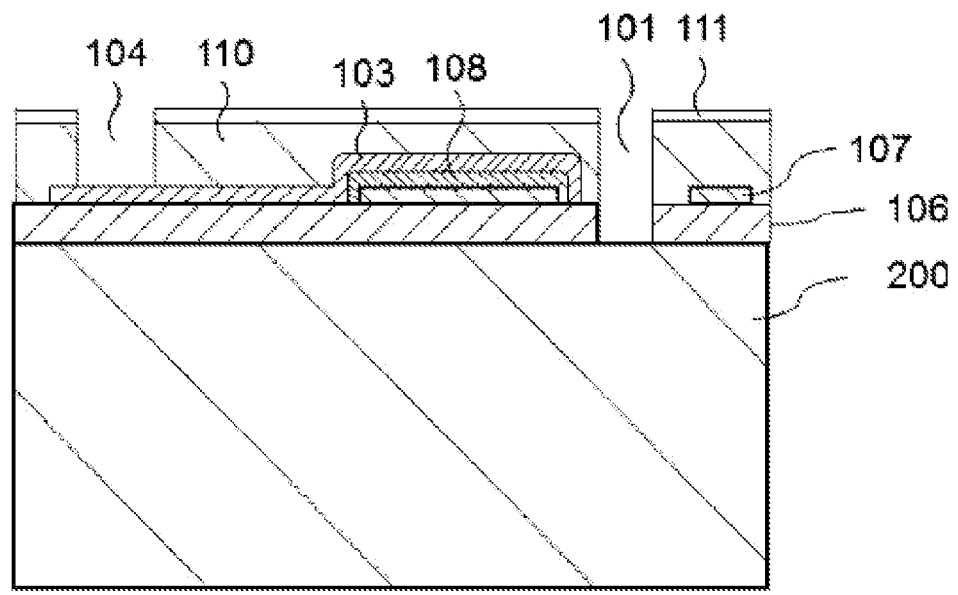
FIG. 12 is a cross-section view of the ink-jet head shown in FIG. 3, taken along the A-A' axis, during the manufacturing process after the step depicted in FIG. 11.

Each actuator 102 includes a piezoelectric film 108 (refer to FIG. 12). Each actuator 102 functions with the piezoelectric film 108 and the two electrodes (i.e., the wiring electrode 103 and the common electrode 107) that sandwich this piezoelectric film 108. When a piezoelectric film is film formed, polarization is generated in the film-thickness direction of the piezoelectric film. When an electrical field with a direction that is the same direction of the polarization is applied to the piezoelectric film via the electrodes, the actuator 102 expands and contracts in the direction that is perpendicular to the direction of the electrical field. Utilizing this expansion and contraction, the oscillating plate 106 deforms in the thickness direction of the nozzle plate 100 and generates a pressure change in the ink inside of the ink pressure chamber 201.

The shape, i.e., footprint, of the piezoelectric film 108 may be circular with a diameter of 170 µm. The piezoelectric film 108 is in a position different from the nozzle 101. In other words, the nozzle 101 is formed on the oscillating plate 106 at a location different from the circular piezoelectric film 108 region that functions as the actuator 102. The center of the piezoelectric film 108 is in a position that is away from the center of the circular cross section of the ink pressure chamber 201. In the present embodiment, the center of the piezoelectric film 108 is configured to be in a position away from the center of the circular cross section of the ink pressure chamber 201, but the center of the circular cross section of the ink pressure chamber 201 and the center of the piezoelectric film 108 can be the same.

The function of the piezoelectric film 108 in performing as the actuator 102 will be described further. The piezoelectric film 108 will contract or expand in the direction that is perpendicular (i.e., the inner surface direction) to the thickness of the film. When the piezoelectric film 108 contracts, the oscillating plate 106 to which the piezoelectric film 108 is linked curves in a direction that expands the ink pressure chamber 201. The expansion of the ink pressure chamber 201 generates a negative pressure on the ink that is preserved in the ink pressure chamber 201. Due to the generated negative pressure, ink is supplied by the ink supply method 400 into the ink pressure chamber 201. When the piezoelectric film 108 expands, the oscillating plate 106 to which the piezoelectric film 108 is linked curves in the direction of the ink pressure chamber. The curve of the oscillating plate 106 in the direction of the ink pressure chamber 201 generates a positive pressure on the ink that is preserved in the ink pressure chamber 201. Due to the generated positive pressure, ink drops are discharged from the nozzle 101 installed on the oscillating plate 106. During the time of the expansion or the contraction of the ink pressure chamber 201, the region surrounding the nozzle 101 of the oscillating plate 106 will deform in the direction that discharges ink due to the displacement of the piezoelectric film 108. In other words, the actuator 102 discharges ink functions due to the bending oscillation.

The actuator 102, as previously mentioned, includes a piezoelectric film 108 having a diameter of 170 µm and is also configured so that the ink pressure chamber diameter is 240 µm. The actuators 102 are configured to be staggered (alternately) in order to position the multiple nozzles 101 at a higher density. The multiple nozzles 101 are arranged in two rows, each row extending linearly in the X-axis direction of FIG. 3. The two rows of nozzles 101 are displaced relative to one another in the Y-axis direction. The center-to-center distance of the nozzles 101 that are in the same row and adjacent in the X-axis direction may be 340 µm. In the Y-axis direction, the array spacing of the two rows of the nozzles 101 may be 240 µm. With placements such as those previously described, the wiring electrode 103 is arranged in between two actuators 102 in the X-axis direction.

For the material of the piezoelectric film, PZT (lead zirconium titanate) may be used. Other materials that can also be used include PTO (PbTiO$_3$: lead titanate), PMNT (Pb(Mg$_{1/3}$ Nb$_{2/3}$) O$_3$—PbTiO$_3$), PZNT (Pb(Zn$_{1/3}$ Nb$_{2/3}$) O$_3$—PbTiO$_3$), ZnO, AlN, etc.

An example process for forming the piezoelectric film 108 is now described. The piezoelectric film 108 is film formed using the RF magnetron sputtering method at a substrate temperature of 350° C. The film thickness is made to be 1 μm. After film forming the piezoelectric film, it is heat-treated for three hours at 500° C. in order to give the piezoelectric film 108 piezoelectricity. With this, a good piezoelectric performance is obtained. Other manufacturing methods for piezoelectric film that can be used, including: CVD (chemical vapor deposition method), sol-gel method, AD method (the aerosol deposition method), and hydrothermal synthesis method. The desired thickness of the piezoelectric film is determined by the piezoelectric property, the breakdown voltage, etc. of the material. The thickness of the piezoelectric film is roughly between 0.1 μm and 5 μm.

The multiple wiring electrodes 103 are one of the two electrodes that connect to the piezoelectric film 108 of the multiple actuators 102. The multiple wiring electrodes 103 are film formed in the upward direction of the up-down direction in FIG. 1 (in other words, the direction in which ink is discharged) with respect to the piezoelectric film 108. Each wiring electrode 103 connects individually to the piezoelectric film 108 of the corresponding actuator 102. Each wiring electrode 103 acts as an individual electrode to independently operate the piezoelectric film 108. Each wiring electrode 103 includes a circular electrode part with a larger diameter than the circular piezoelectric film 108, a wiring part, and a wiring electrode terminal part 104.

An example method for forming the wiring electrodes 103 is now described. The multiple wiring electrodes 103 are formed from a Pt (platinum) thin film. Film forming of the thin film is done using the sputtering method, and the film thickness is made to be 0.5 μm. Other electrode materials that can be used for the wiring electrodes 103 include Ni (nickel), Cu (copper), Al (aluminum), Ti (titanium), W (tantalum), Mo (molybdenum), and Au (gold). Other film forming methods that can be used include vapor deposition and plating. The preferred film thickness of the multiple wiring electrodes 103 is between 0.01 μm and 1 μm.

The common electrode 107 is the other of the two electrodes that connect to the piezoelectric film 108 and is film formed in the lower side in the up-down direction in FIG. 1 (in other words, on the ink pressure chamber 201 side) with respect to the piezoelectric film. The common electrodes 107 are commonly connected to each piezoelectric film and act as common electrodes. They include a wiring part that is placed on the opposite side of the individual electrode wiring part from the actuator 102 and that is concentrated on both ends of the X-axis direction of the nozzle plate 100 and the common electrode terminal part 105.

An example method for forming the common electrode 107 is now described. The common electrode 107 is formed from a Pt (platinum)/Ti (titanium) thin film. Film forming of the thin film is done using the sputtering method, and the film thickness is made to be 0.5 μm. Other electrode materials that can be used for the common electrodes 107 include Ni (nickel), Cu (copper), Al (aluminum), Ti (titanium), W (tantalum), Mo (molybdenum), and Au (gold). Other film forming methods that can be used include vapor deposition and plating. The preferred film thickness of the common electrodes 107 is between 0.01 μm and 1 μm.

The wiring electrode terminal part 104 and the common electrode terminal part 105 are configured to receive signals from an external drive circuit for driving the actuator 102. Since the wiring electrode 103 and the common electrode 107 are wired in between the actuators 102, the wiring width in the present example will be around 80 μm.

The common electrode terminal part 105 is on both sides of the individual wiring electrode terminal part 104. The spacing between each wiring electrode terminal part 104 may be the same 170 μm as the spacing of the nozzles 101 in the X-axis direction. Therefore, compared with the wiring width of the wiring electrode 103, the width of the wiring electrode terminal part 104 in the X-direction can be made wider. For this reason, connection with an external drive circuit is easy. The wiring electrode 103 functions as the individual electrodes that drive the actuator 102.

Next, an example manufacturing method of this ink-jet head, according to an embodiment, is described with reference to FIG. 4 through FIG. 20.

FIG. 4 through FIG. 16 show various states during the manufacturing process of the ink-jet head. The materials that make up the ink-jet head are made by film forming with thin film or by the spin coating method.

Figure 4:
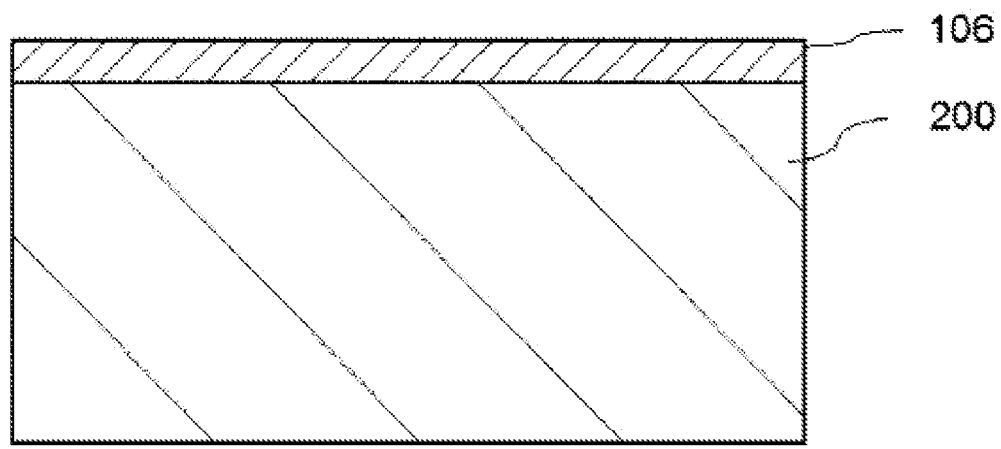
FIG. 4 is a cross-section view of the ink-jet head shown in FIG. 3, taken along the A-A' axis, during a manufacturing process.

FIG. 4 is a cross-section view of the ink-jet head shown in FIG. 3 taken from the left side to the right side along the A-A' axis. FIG. 4 shows a configuration in which an oscillating plate 106 is film formed on the ink pressure chamber structure 200. In order to form the nozzle plate 100, a silicon wafer that has been mirror polished is used for the ink pressure chamber structure 200. In the process to form the nozzle plate 100, since heating and film forming thin film are repeated, a silicon wafer with high heat resistivity is used. The silicon wafer meets the SEMI (Semiconductor Equipment and Materials International) standard and is smoothed to be a thickness of 525 μm to 775 μm. Heat resistant ceramics, quartz or various metal substrates can be used instead of a silicon wafer, as well.

For the oscillating plate 106, the SiO$_2$ film (silicon oxide) that is film formed with the CVD method is used. Film forming with a thickness of 2 μm is conducted on the entire surface of the ink pressure chamber structure 200. In lieu of the CVD method, a thermal oxidation method in which heating a silicon wafer in an oxygen environment to make the surface of the wafer change to an SiO$_2$ film, can be used to form the oscillating plate 106.

The film thickness of the oscillating plate 106 is preferably in the range of 1 μm to 50 μm. Instead of SiO$_2$, SiN (silicon nitride), Al$_2$O$_3$ (aluminum oxide), HfO$_2$ (hafnium oxide), and DLC (Diamond Like Carbon) can be used. The material selection for the oscillating plate 106 is carried out with consideration for heat resistivity, the insulation property (with consideration for the effects of the ink deterioration caused by the drive of the actuator 102 during the time of the use of ink with high conductivity), the thermal expansion coefficient, the smoothness, and the wetting properties with respect to the ink.

Figure 5:
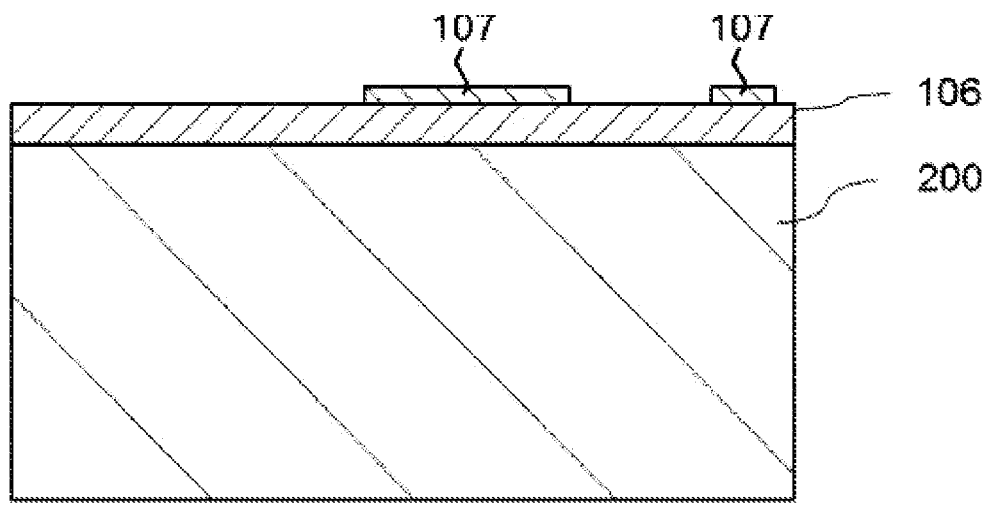
FIG. 5 is a cross-section view of the ink-jet head shown in FIG. 3, taken along the A-A' axis, during the manufacturing process after the step depicted in FIG. 4.

FIG. 5 shows the common electrode 107 that is film formed on the oscillating plate 106, in a state that is the step after that depicted in FIG. 4. The electrode material is Pt/Ti. Ti and Pt are film formed in order, using the sputtering method. The film thickness of Ti is made to be 0.45 μm, and the Pt film thickness is made to be 0.05 μm.

After film forming the electrodes, the electrode film is patterned into a shape, i.e., footprint, appropriate for the actuator 102, the wiring part, and the common electrode terminal part 105, and the common electrode 107 is formed. Patterning is carried out by making an etching mask on the electrode film and by removing all of the electrode material besides the etching mask by etching. The etching mask is formed by applying a photo-sensitive resist material on the electrode film and then by pre-baking and exposure using a mask on which the desired patterns are formed. After the development step, the etching mask is post-baked.

Figure 6:
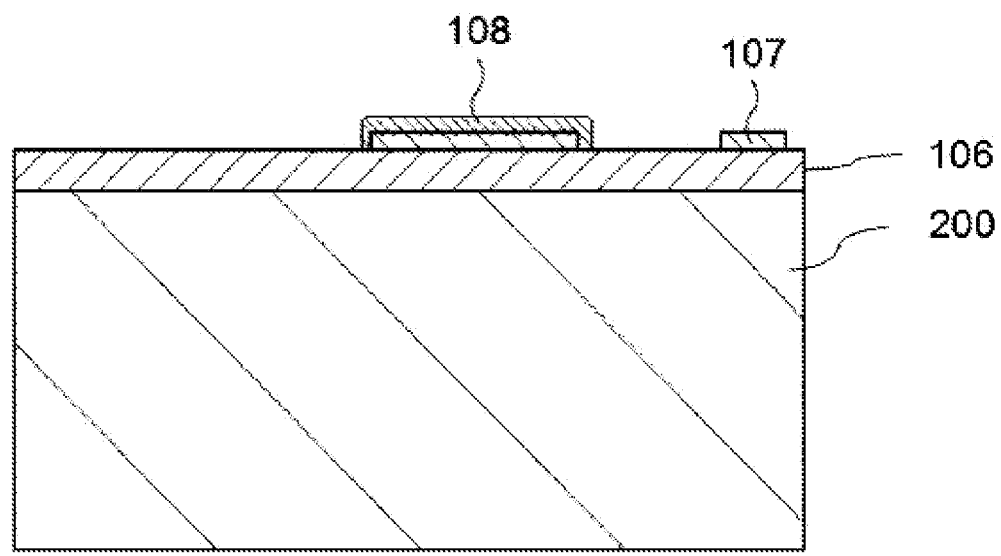
FIG. 6 is a cross-section view of the ink-jet head shown in FIG. 3, taken along the A-A' axis, during the manufacturing process after the step depicted in FIG. 5.

FIG. 6 shows the piezoelectric film 108 formed on the common electrode 107, in a state that is the step after that depicted in FIG. 5. The part of the common electrode 107 that corresponds to the piezoelectric film 108 has a smaller outer diameter than that of the piezoelectric film 108 and has a circular pattern with an outer diameter of 166 μm. By patterning the common electrode 107, the oscillating plate 106, except for the circular part of the common electrode 107 and the wiring part, is exposed.

As shown in FIG. 6, a piezoelectric film 108 is formed on the common electrode 107 that is positioned on the left side and on the oscillating plate 106. PZT may be used for the piezoelectric film 108. A piezoelectric film 108 with a thickness of 1 μm is formed using the sputtering method at a substrate temperature of 350° C. In order to give piezoelectric properties to the PZT thick film, heat treatment is carried out for 3 hours at 500° C. When film forming the PZT thin film, polarization is generated from the common electrode 107 along the direction of the film thickness.

The patterning of the piezoelectric film 108 is carried out by etching. After applying the photo-sensitive resist on the piezoelectric film 108, the pre-bake process is carried out, and then exposure is carried out using a mask on which the desired patterns are formed. After the development and the fixing steps, the piezoelectric film is post-baked, and the etching mask of the photo-sensitive resist is formed. Etching is carried out using this etching mask, and a piezoelectric film 108 with the desired form is obtained.

The pattern of the piezoelectric film 108 is, as previously mentioned, circular with an outer diameter of 170 μm. Since the outer diameter of the circular common electrode 107 is 166 μm, a piezoelectric film 108 is formed so that it covers the common electrode 107 which constitutes the actuator 102. By the piezoelectric film 108 covering the common electrode 107, insulation between the other wiring electrode 103 for applying the voltage to the common electrode 107 and the piezoelectric film 108 can be secured. That is, the wiring electrode 103 and the common electrode 107, which become the individual electrodes to drive the actuator 102, are insulated by the piezoelectric film 108.

Figure 7:
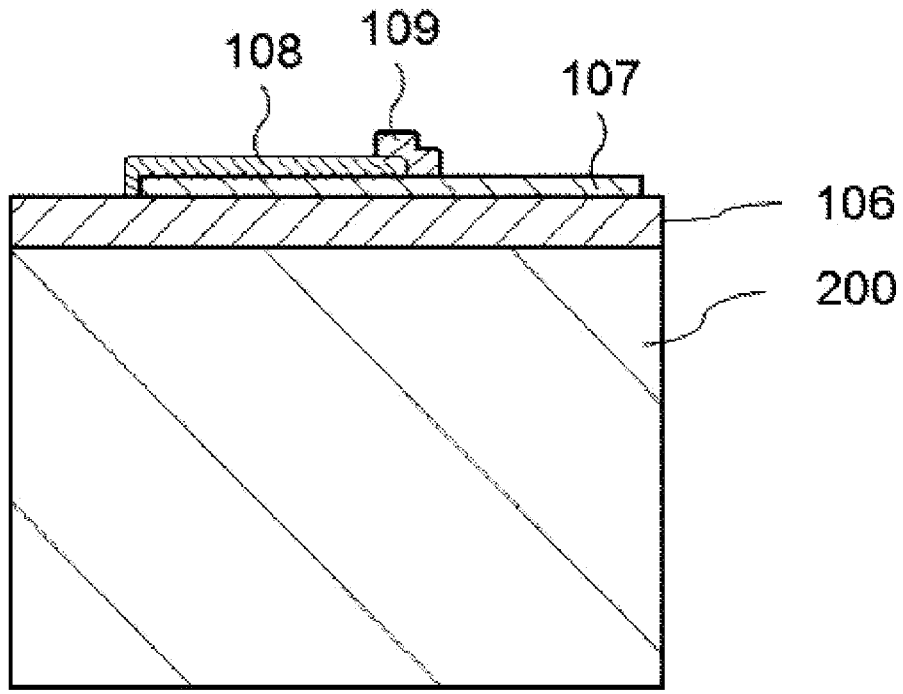
FIG. 7 is a cross-section view of the ink-jet head shown in FIG. 3, taken along the B-B' axis, during the manufacturing process after the step depicted in FIG. 5.

FIG. 7 is a cross-section view of the ink-jet head shown in FIG. 3, taken from the left side to the right side along the B-B' axis. FIG. 7 shows an insulating film 109 on the piezoelectric film 108 and the common electrode 107 in the location corresponding to E in FIG. 3. The insulating film 109 forms an insulating film on the surface of the piezoelectric film 108 and the common electrode 107 in order to maintain the insulation of the wiring part of the common electrode 107 and the wiring electrode 103, which the actuator 102 includes. The thickness of the insulating film 109 is made to be 0.2 μm, and the material is $SiO_2$. For film forming, the CVD method is used, which can achieve good insulating properties by low-temperature film forming. The insulating film 109 needs only to be film formed on the surface of the piezoelectric film 108 and the common electrode 107, so patterning is conducted. After applying resist, the pre-bake process is carried out, and then exposure is carried out using a mask on which the desired patterns are formed. After the development and fixing steps, the insulating film is post-baked, and the etching mask is formed. Etching is carried out using this etching mask, and an insulating thin film is obtained. Taking into consideration variations in accuracy of the patterning process, the insulating film 109 is patterned so that the film will cover a part of the piezoelectric film 108. The amount that the insulating layer 109 covers the piezoelectric film 108 is made to a degree in which the amount of deformation of the piezoelectric film 108 would not be inhibited.

Figure 8:
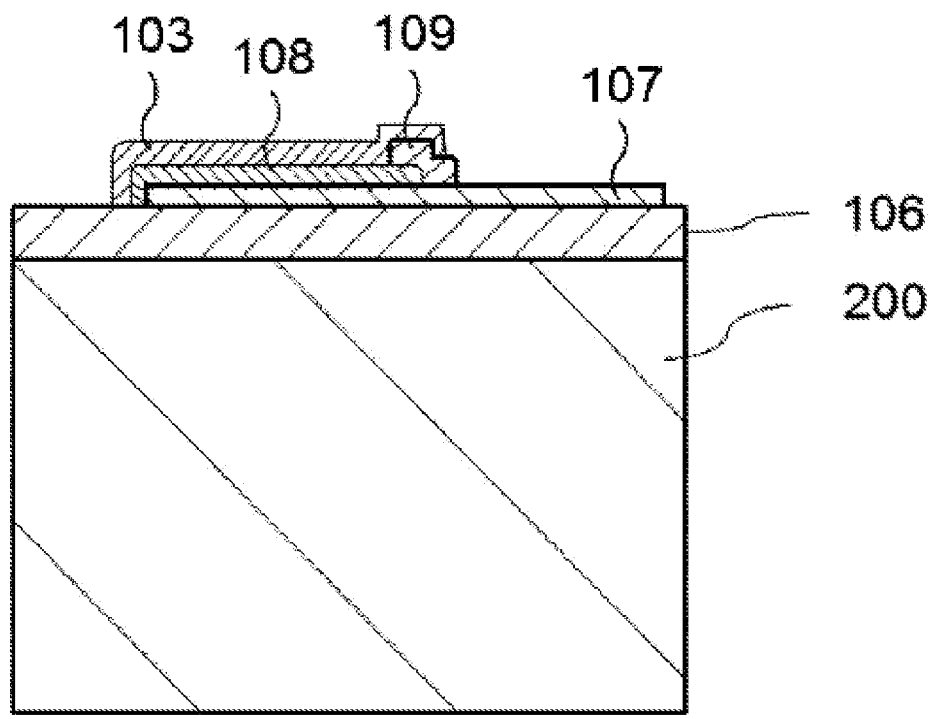
FIG. 8 is a cross-section view of the ink-jet head shown in FIG. 3, taken along the B-B' axis, during the manufacturing process after the step depicted in FIG. 7.
Figure 9:
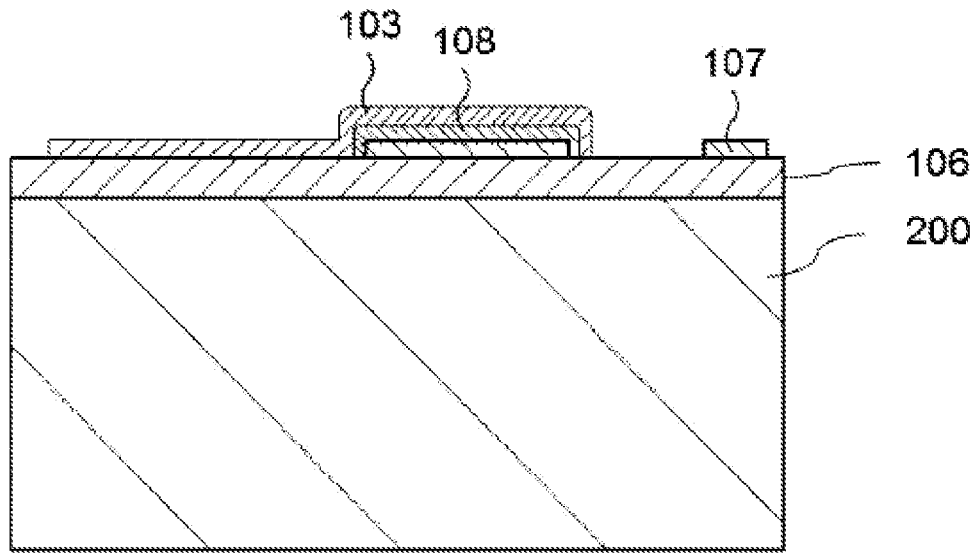
FIG. 9 is a cross-section view of the ink-jet head shown in FIG. 3, taken along the A-A' axis, during the manufacturing process after the step depicted in FIG. 7.

FIG. 8 is a cross-section view of the ink-jet head taken along B-B' in FIG. 3, in a state that is the step after that depicted in FIG. 7. FIG. 9 is likewise a cross-section view of the ink-jet head taken along A-A' in FIG. 3, in a state that is the step after that depicted in FIG. 7. Both diagrams show the wiring electrodes 103 that are film formed on the oscillating plate 106, piezoelectric film 108, and the insulating film 109. The wiring electrode film is Pt with a film thickness of 0.5 μm. An wiring electrode film 103 is film formed using the sputtering method. After film forming the electrodes, electrode films are patterned in shapes, i.e., footprints, that are suitable for the actuator 102, the wiring part, and the wiring electrode terminal part 104 to form the wiring electrode 103. Patterning is carried out by making an etching mask on the electrode film and by removing all of the electrode material except for the etching mask by etching. The etching mask is formed by applying the photo-sensitive resist on the electrode film and then by pre-baking and exposure using a mask on which the desired patterns are formed. After the development step, the etching mask is post-baked.

The part of the wiring electrode 103 that corresponds to the piezoelectric film 108 has a circular pattern with an outer diameter of 174 μm. The wiring electrode 103 which constitutes the actuator 102 is in a form that covers the piezoelectric film 108.

Other film forming materials that can be used for the wiring electrode 103 include Cu, Al, Ag, Ti, W, Mo, Pt, and Au. Other film forming methods that can be used for the wiring electrode 103 include vacuum vapor deposition and plating. The film thickness of the wiring electrode 103 is preferably in the range of 0.01 μm to 1 μm.

Figure 10:
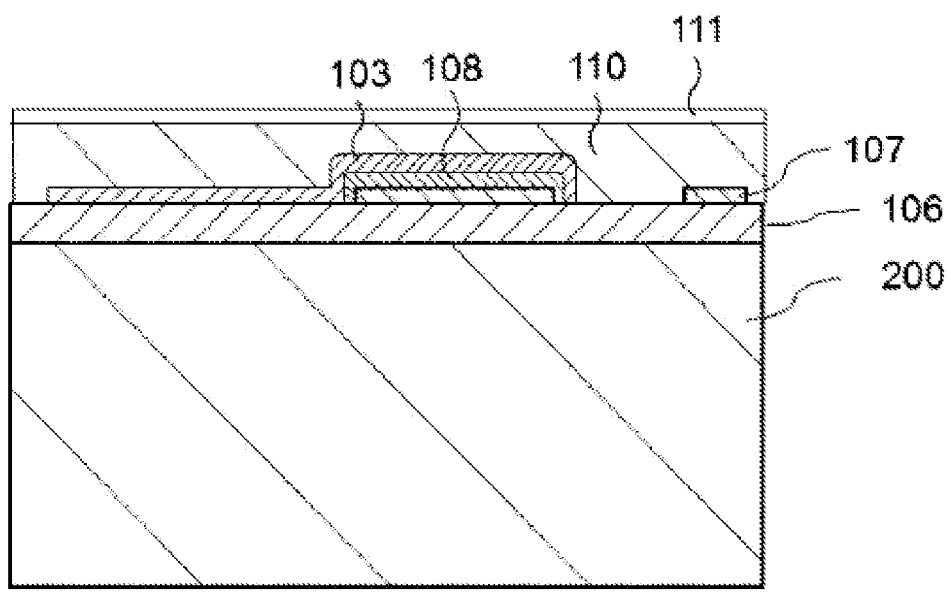
FIG. 10 is a cross-section view of the ink-jet head shown in FIG. 3, taken along the A-A' axis, during the manufacturing process after the step depicted in FIG. 9.

FIG. 10 shows the protective film 110 and the metal film 111 that are film formed on the oscillating plate 106, the wiring electrode 103, the common electrode 107, and the insulating film 109. In the FIG. 10 cross section, the insulating film 109 cannot be seen. The protective film 110 is a polyimide with a film thickness of 3 μm. After film forming a solution including a polyimide precursor with a spin coating method, the protective film 110 is formed by conducting heat polymerization and solvent removal by baking. By film forming using the spin coating method, the actuator 102 that is formed on the oscillating plate 106, the wiring electrode 103, and the common electrode 107 are coated, and a film with a smooth surface is formed.

For the resin material of the protective film 110, instead of polyimide, plastic materials such as ABS (acrylonitrile butadiene styrene), polyacetal, polyamide, polycarbonate, and polyethersulfon can also be used. Also for the ceramic material, nitrides and oxides such as zirconia, silicon nitride, and barium titanate etc. can be used. If the insulation of the wiring electrode 103 and the common electrode 107 are maintained, it is also possible to use metal materials (alloys), and representative materials include materials such as aluminum, SUS, and titanium. Other film forming methods that can be used include CVD, vacuum vapor deposition, and plating. The film thickness of the protective film 110 is preferably in the range of 1 μm to 50 μm.

Furthermore, regarding the material selection for the protective film 110, materials with a Young's modulus that differs greatly from the oscillating plate 106 material, are desirable. The amount of deformation of the plate form is affected by the Young's modulus of the plate material and the plate thickness. Even when the same force is applied, the smaller the Young's modulus is, and the thinner the plate thickness is, the larger the deformation becomes. In the embodiment, the Young's modulus of the $SiO_2$ film of the oscillating plate 106 is 80.6 GPa, and the Young's modulus of the polyimide film of the protective film 110 is 10.9 GPa; therefore, the difference in the Young's modulus is 69.7 GPa. The reason for this is described.

The ink-jet head 1 of the present embodiment is structured so that the actuator 102 is sandwiched between the oscillating plate 106 and the protective film 110. If an electrical field is applied to the actuator 102 and the actuator 102 expands in the direction that is perpendicular to the direction of the electrical field, a force that deforms the actuator 102 in a concave form with respect to the ink pressure chamber 201 side is loaded on the oscillating plate 106. Conversely, a force that deforms the actuator 102 in a convex form with respect to the ink pressure chamber 201 side is loaded on the protective film 110. If the actuator 102 contracts in the direction that is perpendicular to the direction of the electrical field, a force that deforms the oscillating plate 106 in a convex form with respect to the ink pressure chamber 201 and that deforms the protective film 110 in a concave form with respect to the ink pressure chamber 201 is loaded. That is, when the actuator 102 expands and contracts in the direction that is perpendicular to the direction of the electrical field, a force is loaded so that the oscillating plate 106 and the protective film 110 deforms in the opposite direction. For this reason, if the Young's modulus for the film thickness of the oscillating plate 106 and the protective film 110 is the same, even if voltage is applied to the actuator 102, since a force that will deform the oscillating plate 106 and the protective film 110 in the opposite direction but the same deformation amount, the nozzle plate 100 will not deform, and ink will not be discharged.

In the present embodiment, since the Young's modulus of the polyimide film of the protective film 110 is smaller than that of the $SiO_2$ film of the oscillating plate 106, the amount of the deformation caused by the same force will be larger for the protective film 110. In the structure of the present embodiment, if the actuator 102 expands in the direction that is perpendicular to the direction of the electrical field, the nozzle plate 100 deforms in a convex form with respect to the ink pressure chamber 201 side and the volume of the pressure chamber 201 shrinks. The volume of the pressure chamber 201 shrinks because the amount that the protective film 110 deforms in a convex form with respect to the ink pressure chamber 201 side is larger.

Conversely, if the actuator 102 contracts in the direction that is perpendicular to the direction of the electrical field, the nozzle plate 100 deforms in a concave form with respect to the ink pressure chamber 201 side, and the volume of the pressure chamber 201 expands. The volume of the pressure chamber 201 expands because the amount that the protective film 110 deforms in a concave form with respect to the ink pressure chamber 201 side is larger.

The larger the difference in the Young's modulus of the oscillating plate 106 and the protective film 110 is, the larger the difference in the amount of the deformation of the oscillating plate when applying the same voltage to the actuator is. For this reason, the larger that the difference in the Young's modulus of the oscillating plate 106 and the protective film 110 is, ink discharge becomes possible at a lower voltage condition.

Meanwhile, as previously mentioned, the amount of the deformation of the plate form is affected by not only the Young's modulus of the plate material but also by the plate thickness. For this reason, in order to differ the amount of the deformation of the oscillating plate 106 and the protective film 110, it is necessary to take into consideration not only the Young's modulus of the material but also the film thickness of each. Even if the Young's modulus of the materials of the oscillating plate 106 and the protective film 110 is the same, if there is a difference in the film thickness, ink discharge is possible, albeit under a high-voltage condition.

Other than the above, the material selection for the protective film 110 is carried out with consideration for the heat resistivity, the insulation property (with consideration for the effects of ink deterioration caused by the drive of the actuator 102 during the time of the use of ink with high conductivity), the thermal expansion coefficient, the smoothness, and the wetting properties with respect to the ink.

The metal film 111 is an aluminum film and is film formed on the polyimide film using the sputtering method at 0.4 µm. The metal film 111 is used as a mask when dry etch processing the protective film 110 and the oscillating plate 106, mentioned below.

For the metal film 111, instead of aluminum, Cu, Ag, Ti, W, Mo, Pt, or Au can be used. Other film forming methods for the metal film 111 that can be used include CVD, vacuum vapor deposition, and plating. The film thickness of the metal film 111 is preferably in the range of 0.01 µm to 1 µm.

Figure 11:
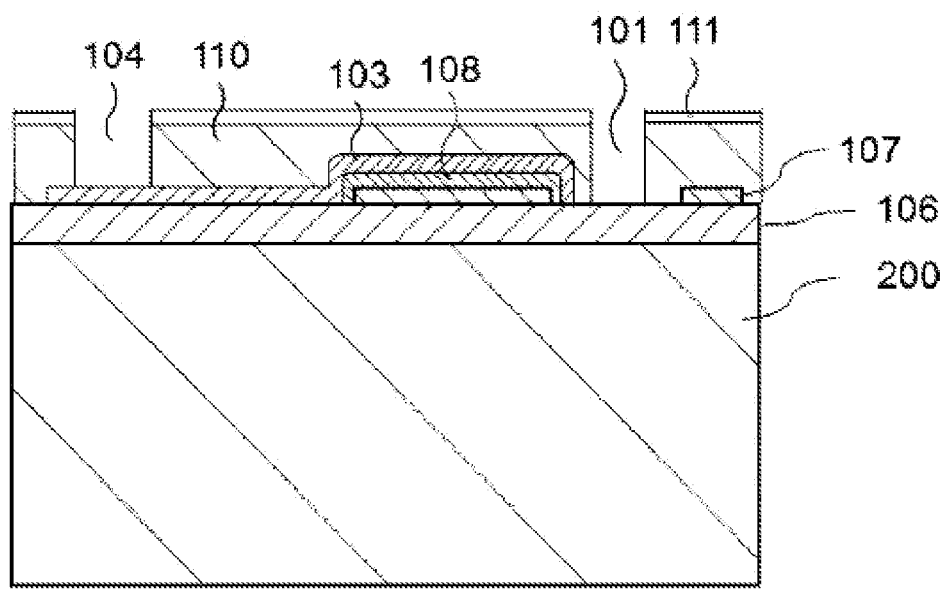
FIG. 11 is a cross-section view of the ink-jet head shown in FIG. 3, taken along the A-A' axis, during the manufacturing process after the step depicted in FIG. 10.

FIG. 11 shows the metal film 111 and the protective film 110 that are patterned in a form that is appropriate for the nozzle 101 and the wiring electrode terminal part 104. This patterning method is now described.

First, using the photo-sensitive resist and the etching method on the metal film 111, the metal film 111 is etch processed in the circular-pattern shape of the nozzle 101 with a 20-µm diameter and in the square-pattern shape of the wiring electrode terminal part 104 and the common electrode terminal part 105 shown in FIG. 3.

Next, using the patterned metal film 111 as a mask, dry etching is conducted on the protective film 110, and the circular-pattern form of the nozzle 101 and the square-pattern shape of the wiring electrode terminal part 104 and the common electrode terminal part 105 in FIG. 3 are formed.

FIG. 12 shows the oscillating plate 106 that is patterned in a shape appropriate for the nozzle 101. The patterning of the oscillating plate 106 is formed using dry etch processing using the metal film 111 and the wiring electrode 103 of the wiring electrode terminal part 104 as the mask. Since the wiring electrode 103 has a resistance to etching gas like the metal film 111, the oscillating plate 106 below the wiring electrode terminal part 104 is not etched.

Figure 13:
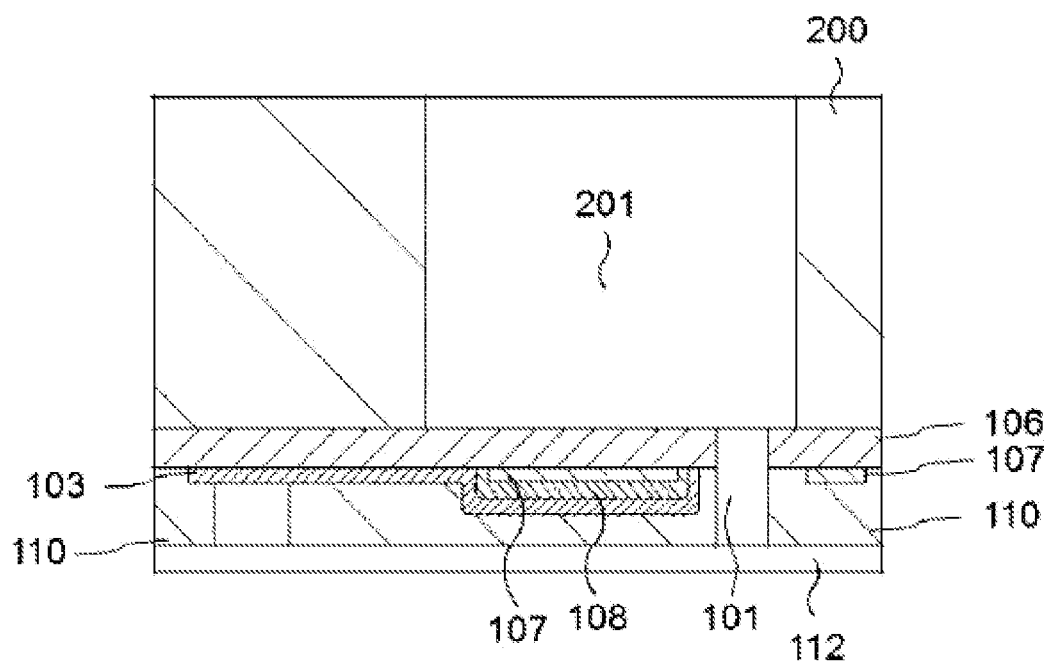
FIG. 13 is a cross-section view of the ink-jet head shown in FIG. 3, taken along the A-A' axis, during the manufacturing process after the step depicted in FIG. 12.

FIG. 13 shows the ink pressure chamber 201 that is formed in the ink pressure chamber structure 200 by adhering a protective film cover tape 112 on the protective film 110 and turning the ink pressure chamber structure 200 upside down. The ink pressure chamber 201 has a cylindrical shape with a diameter of 240 µm. The center position of the ink pressure chamber 201 and the center position of the nozzle 101 are not aligned. Compared to FIG. 12, the ink-jet head is upside down.

The patterning method of the ink pressure chamber 201 is now described. After removing the metal film 111 in FIG. 12 by etching, the protective film cover tape 112 is adhered. For the protective film cover tape 112, a back surface protective tape for the silicon wafer Chemical Mechanical Polishing (CMP) is used.

An etching mask is made on the ink pressure chamber structure 200, which is a silicon wafer with a thickness of 725 µm. For example, a vertical deep dry etching process technology called Deep-RIE used exclusively for silicon substrates, such as described in Sumitomo Precision Products Co. Ltd. application WO2003/030239, may be implemented. Upon removal of the silicon wafer besides the etching mask, the ink pressure chamber 201 is formed. The etching mask is formed by applying the photo-sensitive resist on the ink pressure chamber structure 200 and then by pre-baking and exposure using a mask on which the desired patterns are formed. After the development step, the etching mask is post-baked.

In the Deep-RIE process technology, used exclusively for silicon substrates, SF6 is used for the etching gas, but the SF6 gas does not have an etching effect on the $SiO_2$ film of the oscillating plate 106 or the polyimide film of the protective film 110. For this reason, the progression of the dry etching of the silicon wafer that forms the ink pressure chamber 201 is stopped at the oscillating plate 106. That is, the $SiO_2$ film of the oscillating plate 106 acts as the stop layer for the Deep-RIE etching.

In the previous description, for the etching methods, wet etching using chemicals and dry etching using plasma are accordingly selected. Processing is carried out by changing the etching methods and etching conditions depending on the materials of the insulating film, the electrode film, and the piezoelectric film. After the etching process by each photo-sensitive resist film is finished, the resist removal is conducted on the left over the photo-sensitive resist film using a dissolution fluid.

Figure 14:
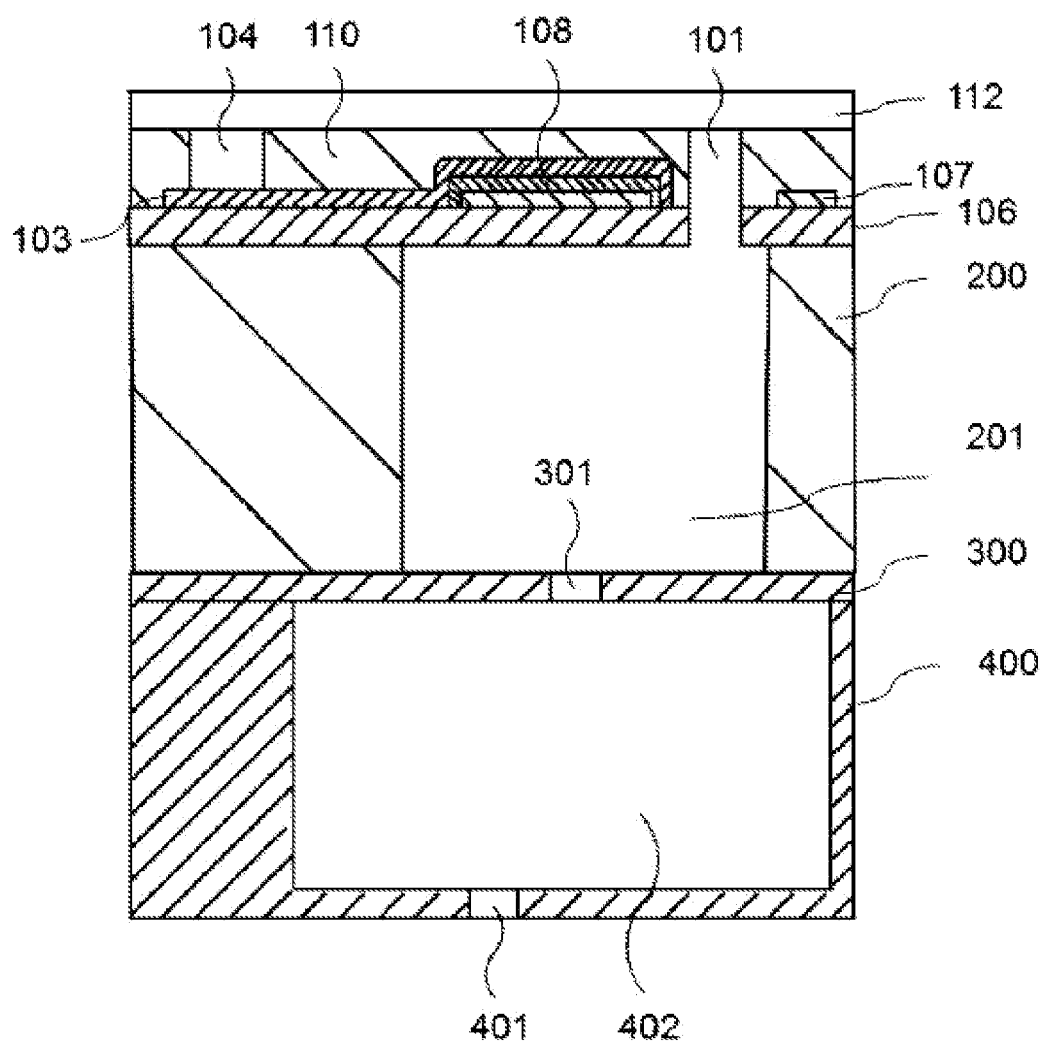
FIG. 14 is a cross-section view of the ink-jet head shown in FIG. 3, taken along the A-A' axis, during the manufacturing process after the step depicted in FIG. 13, and inverted compared to FIG. 13.

FIG. 14 shows a cross section of ink-jet print head including the ink pressure chamber structure 200 with the separate plate 300 and the ink supply route structure 400 adhered to it. The separate plate 300 and the ink supply route structure are bonded together by an epoxy resin agent. After bonding the separate plate 300 and the ink supply route structure 400, the separate plate 300 is bonded to the ink pressure chamber structure 200.

In the present embodiment, the nozzle plate 100 is composed of the oscillating plate 106, the common electrode 107, the wiring electrode 103, the piezoelectric film 108, and the protective film 110, all of which are formed on the ink pressure chamber structure 200. Instead of the method in which the nozzle plate 100 is affixed to the ink pressure chamber structure 200, it is possible to make one surface of the ink pressure chamber structure 200 as the oscillating plate instead of separately making the nozzle plate 100 and the ink pressure chamber structure 200. For example, the electrodes and the piezoelectric film are formed on one surface of the ink pressure chamber structure 200, and a hole that does not penetrate the ink pressure chamber structure 200 is formed in a position that corresponds to the ink pressure chamber from the other surface side. A thin layer is left on one surface side of the ink pressure chamber structure 200, and this part functions as the oscillating plate. In this configuration method, a part of the ink pressure chamber structure 200 can be used as the nozzle plate 100 without using the nozzle plate 100.

Figure 15:
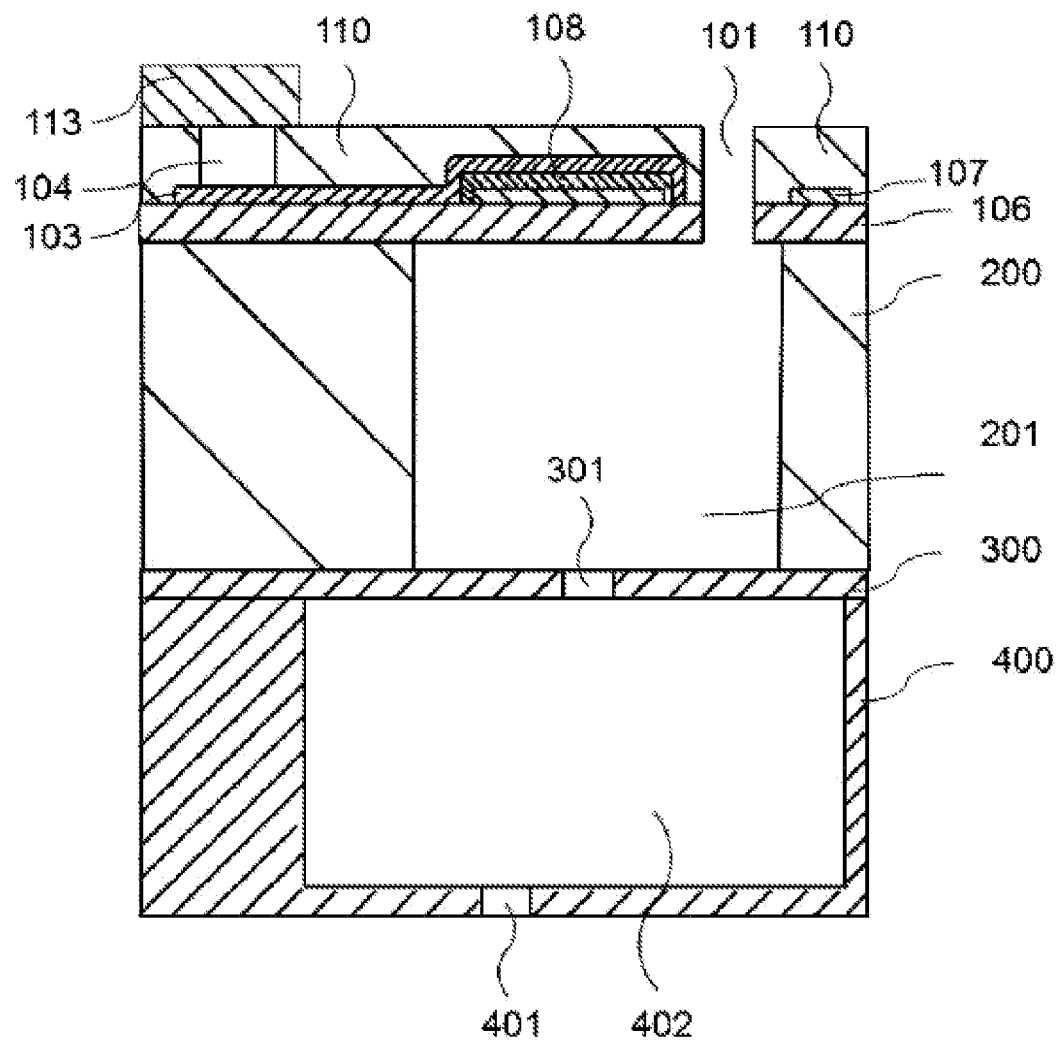
FIG. 15 is a cross-section view of the ink-jet head shown in FIG. 3, taken along the A-A' axis, during the manufacturing process after the step depicted in FIG. 14.

FIG. 15 shows a cross section of the ink-jet print head including an electrode terminal part cover tape that is adhered to the wiring electrode terminal part 104 of the protective film 110. By conducting ultraviolet irradiation from the protective film cover tape 112 side in FIG. 14, the bonding strength of the protective film cover tape 112 is weakened and peeled off. After the protective film cover tape 112 is peeled off, in the region of the wiring electrode terminal part 104 (and the common electrode terminal part 105 in FIG. 3), an electrode terminal part cover tape 113 is adhered. This cover tape is a resin product. The cover tape 113 has an adhesion strength of about the same as that of cellophane tape, which can be applied and removed easily. The electrode terminal part cover tape 113 is adhered with the aim of preventing dust from adhering to the wiring electrode terminal part 104 and the common electrode terminal part 105. The electrode terminal part cover tape 113 is also adhered with the aim of preventing the adhesion of the ink-repellent film 114 during the time of film forming an ink-repellent film 114, discussed below.

Figure 16:
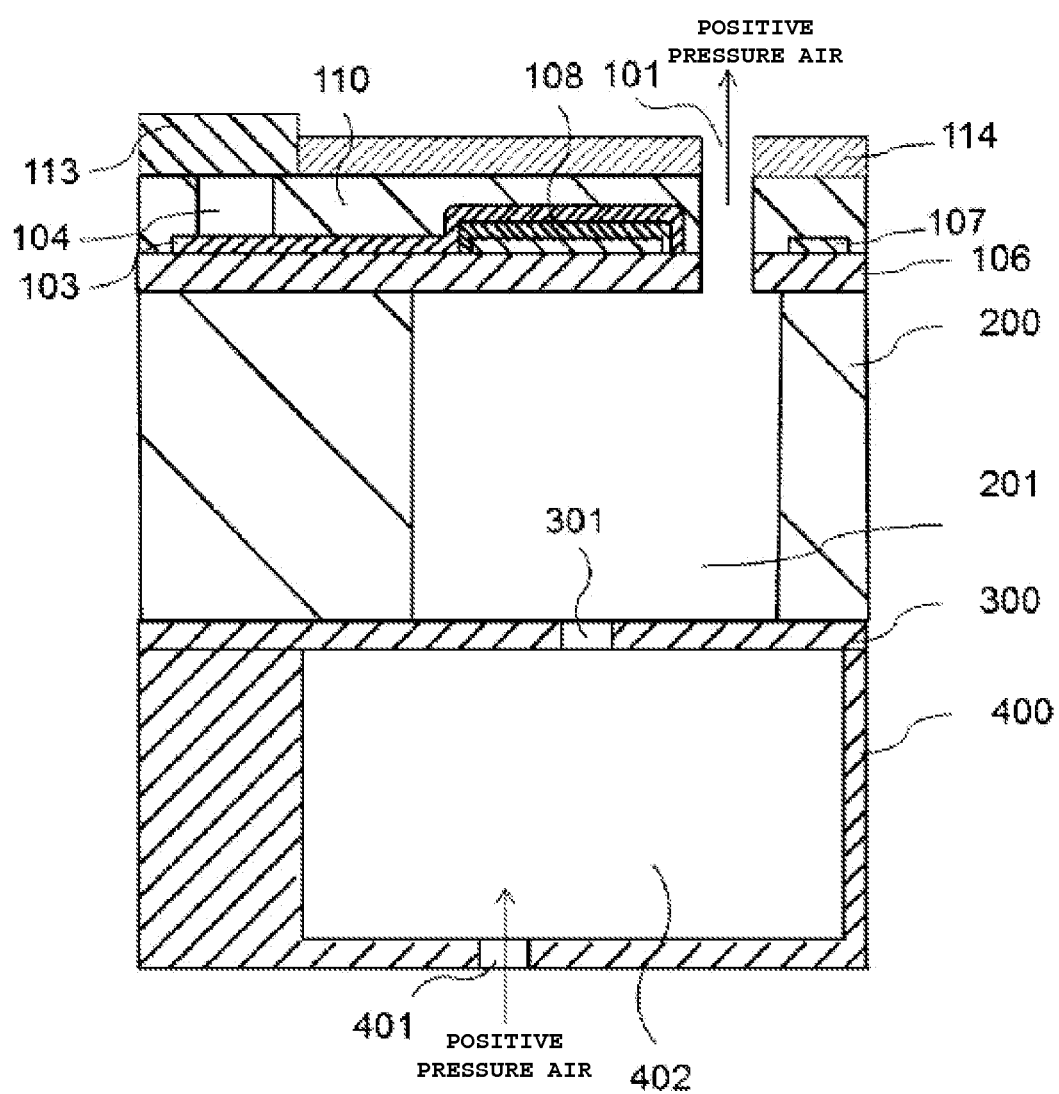
FIG. 16 is a cross-section view of the ink-jet head shown in FIG. 3, taken along the A-A' axis, during the manufacturing process after the step depicted in FIG. 15.

FIG. 16 shows a cross section of the ink-jet head, including the ink-repellent film 114 formed on the protective film 110, and not formed on the inner wall of the nozzle 101. The materials for the ink-repellent film 114 are silicone liquid-repellent materials and fluoride-containing organic materials that possess liquid-repelling properties. In this embodiment, the commercially available fluoride-containing organic material Cytop (trademark) manufactured by Asahi Glass Co. Ltd. is used. The film thickness of the ink-repellent film 114 is 1 μm.

The ink-repellent film 114 is film formed by spin coating the liquid ink-repellent film material on the protective film 110. At the time of this spin coating, in combination with the fixing of the ink-jet head 1, positive pressure air is injected from the ink supply path 401. The positive pressure air is emitted from the nozzle 101, which is connected to the ink supply path 401. The liquid ink-repellent film material is applied in this state, and the ink-repellent film 114 is formed on the protective film 110, without the ink-repellent material adhering to the ink flow path of the nozzle 101 inner wall.

Figure 17:
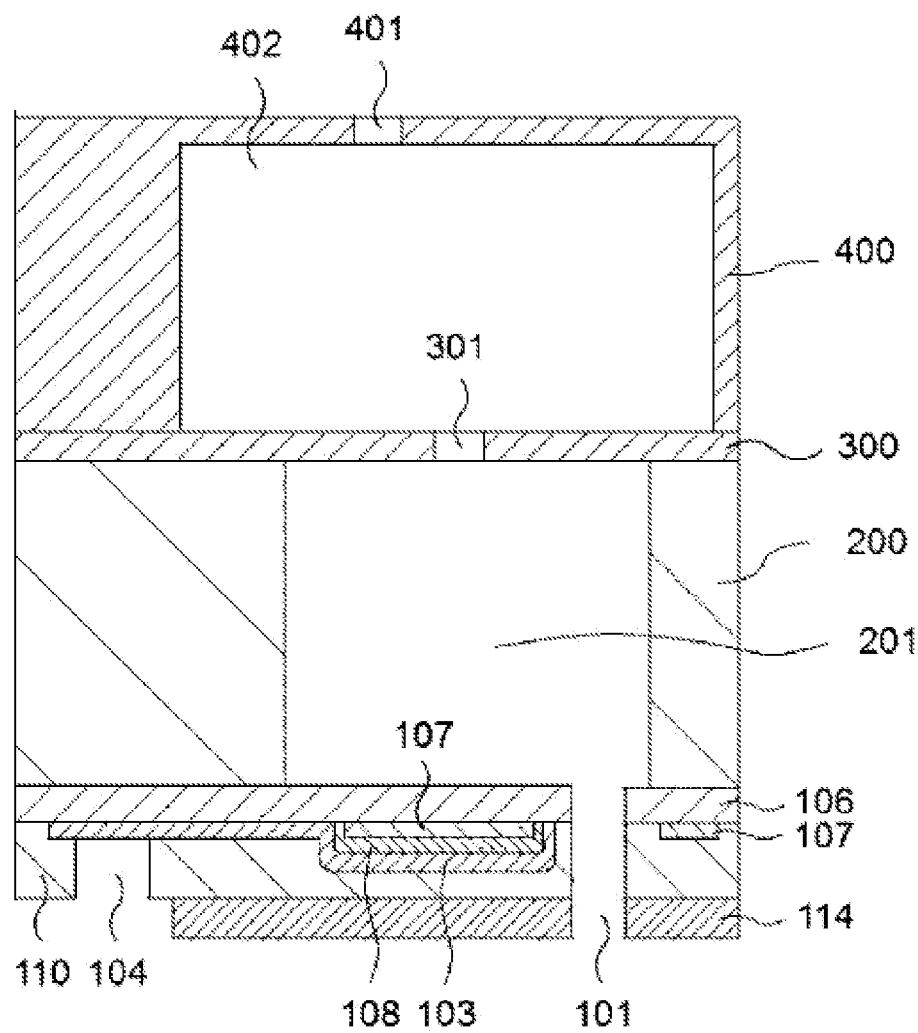
FIG. 17 is a cross-section view of the ink-jet head shown in FIG. 3, taken along the A-A' axis, in a state that is after finishing the step depicted in FIG. 16.

FIG. 17 shows a cross section of the ink-jet head 1 after the manufacturing is complete. The ink is supplied from the ink supply port 401 that is installed on the ink supply route structure 400 to the ink supply path 402. The ink in the ink supply path flows into each ink pressure chamber 201 via the ink supply inlet 301 and fills each nozzle 101. The ink that is supplied from the ink supply port 401 is maintained so that it will have an appropriate negative pressure, and the ink inside the nozzle 101 will be maintained without leaking from the nozzle 101.

Figure 18:
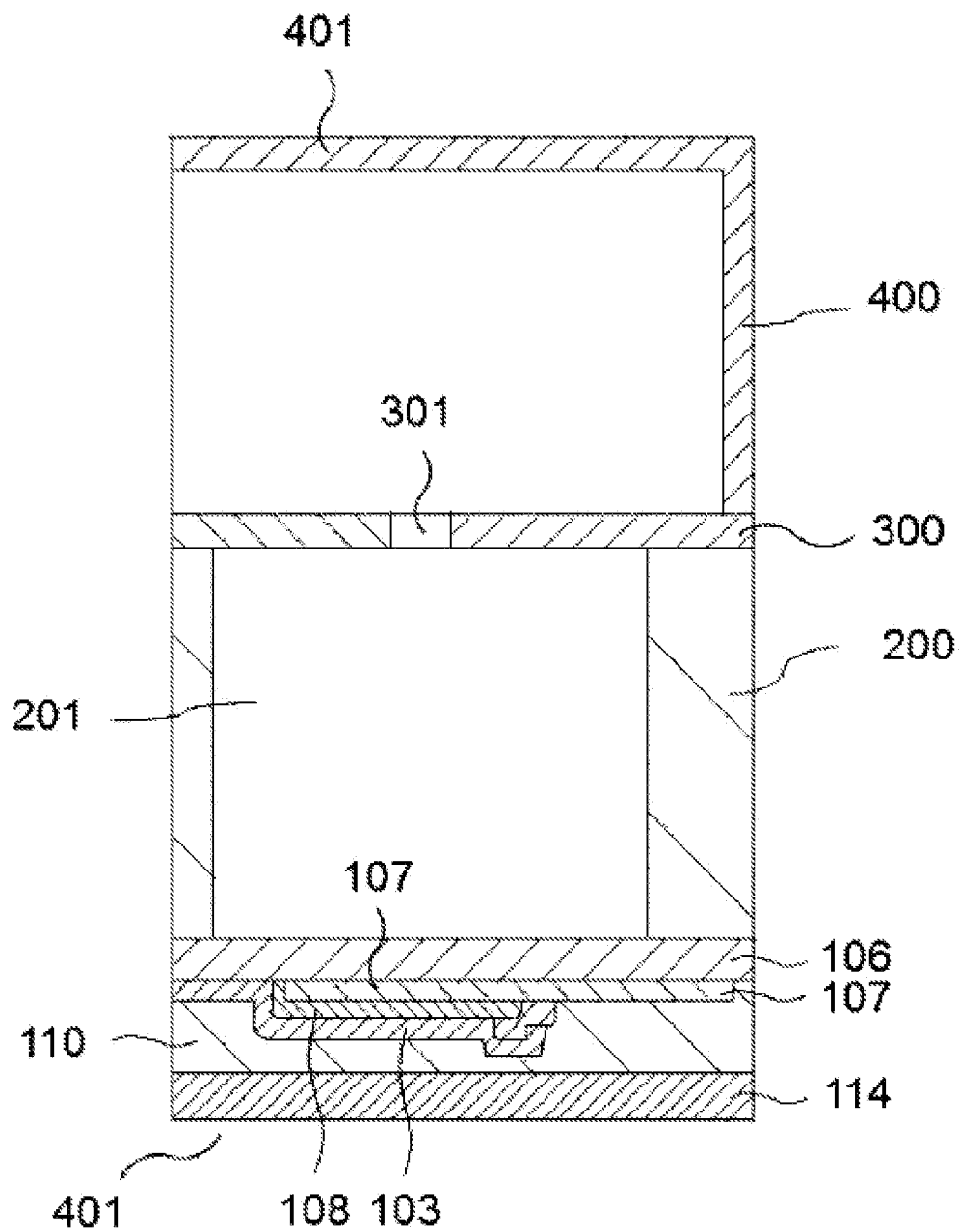
FIG. 18 is a cross-section view of the ink-jet head shown in FIG. 3, taken along the B-B' axis, in a state that is after finishing the step of that depicted in FIG. 16.

FIG. 18 is a cross section of the ink-jet head, taken across B-B' in FIG. 3, and including the actuator 102 part. Where it differs from FIG. 7 (n), which corresponds to A-A' in FIG. 3, is that, in the place that corresponds to E in FIG. 3, there is an insulating film 109 between the wiring electrode 102 and the common electrode 107.

Figure 19:
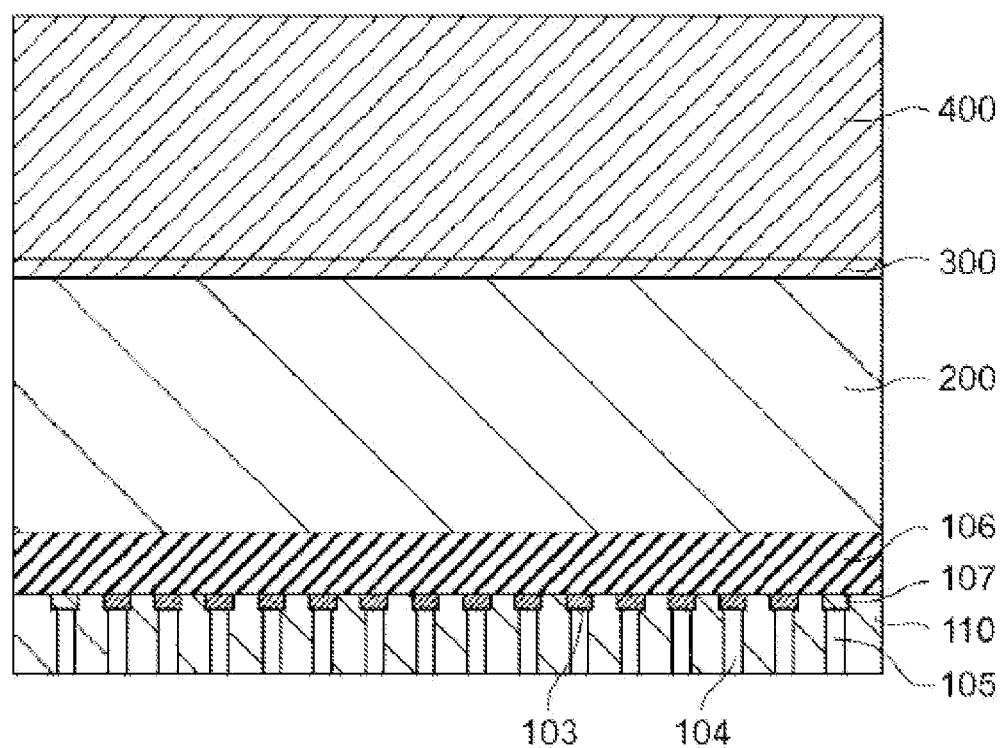
FIG. 19 is a cross-section view of the ink-jet head shown in FIG. 3, taken along the C-C' axis, in a state that is after finishing the step of that depicted in FIG. 16.

FIG. 19 is a cross section of the ink-jet head, taken across C-C' in FIG. 3, and including the wiring electrode terminal part 104 and the common electrode terminal part 105. Only the wiring electrode terminal part 104 and the common electrode terminal part 105 have the protective film 110 etched, and the ink-repellent film 114 is not film formed on the protective film 110.

Figure 20:
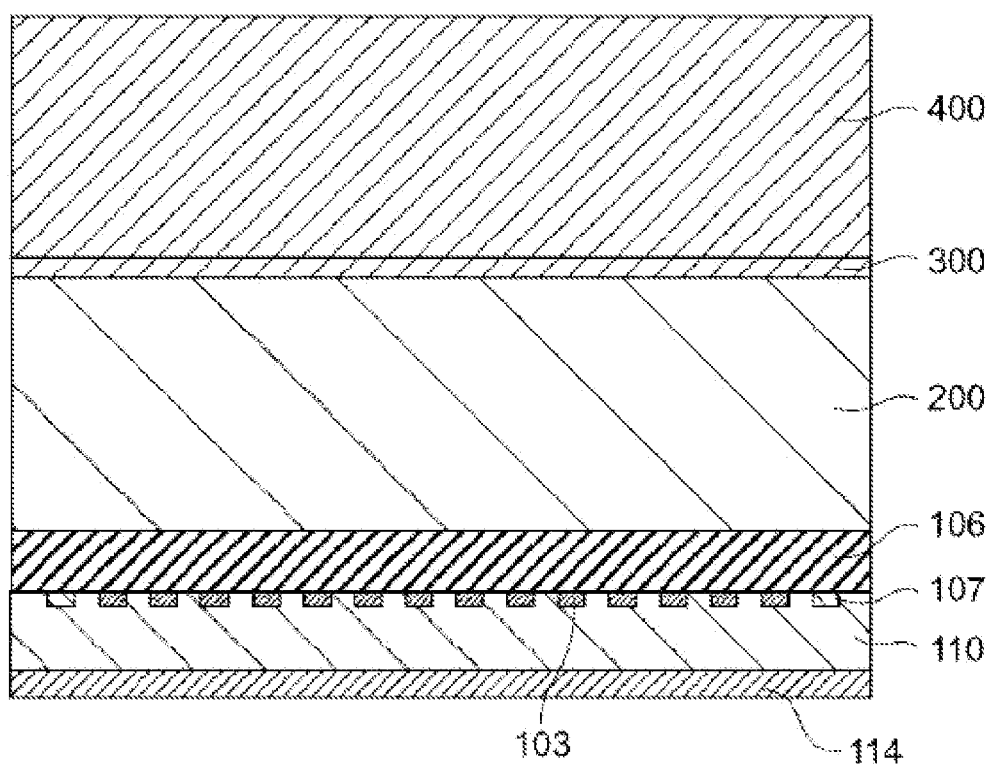
FIG. 20 is a cross-section view of the ink-jet head shown in FIG. 3, taken along the D-D' axis, in a state that is after finishing the step of that depicted in FIG. 16.

FIG. 20 is a cross section of the ink-jet head, taken across D-D' in FIG. 3, showing the wiring part of the wiring electrode 103 and the common electrode 105. Unlike FIG. 8, a protective film 110 is formed on the wiring, and the ink-repellent film 114 is also film formed on the protective film 110.

The present embodiment is configured so that the nozzle 101 is installed in a location that is different from the piezoelectric film 108 that forms the actuator, that is, outside of the region of the piezoelectric film 108. In the case of installing a nozzle within the region of the piezoelectric film 108, accuracy is needed in the positioning of the nozzle, the piezoelectric film, the wiring electrode, and the common electrode. With the present embodiment, since the nozzle 101 is installed in a location different from the actuator 102, it becomes easy to conduct the alignment of the actuator 102 and the nozzle 101.

Second Embodiment

Figure 21:
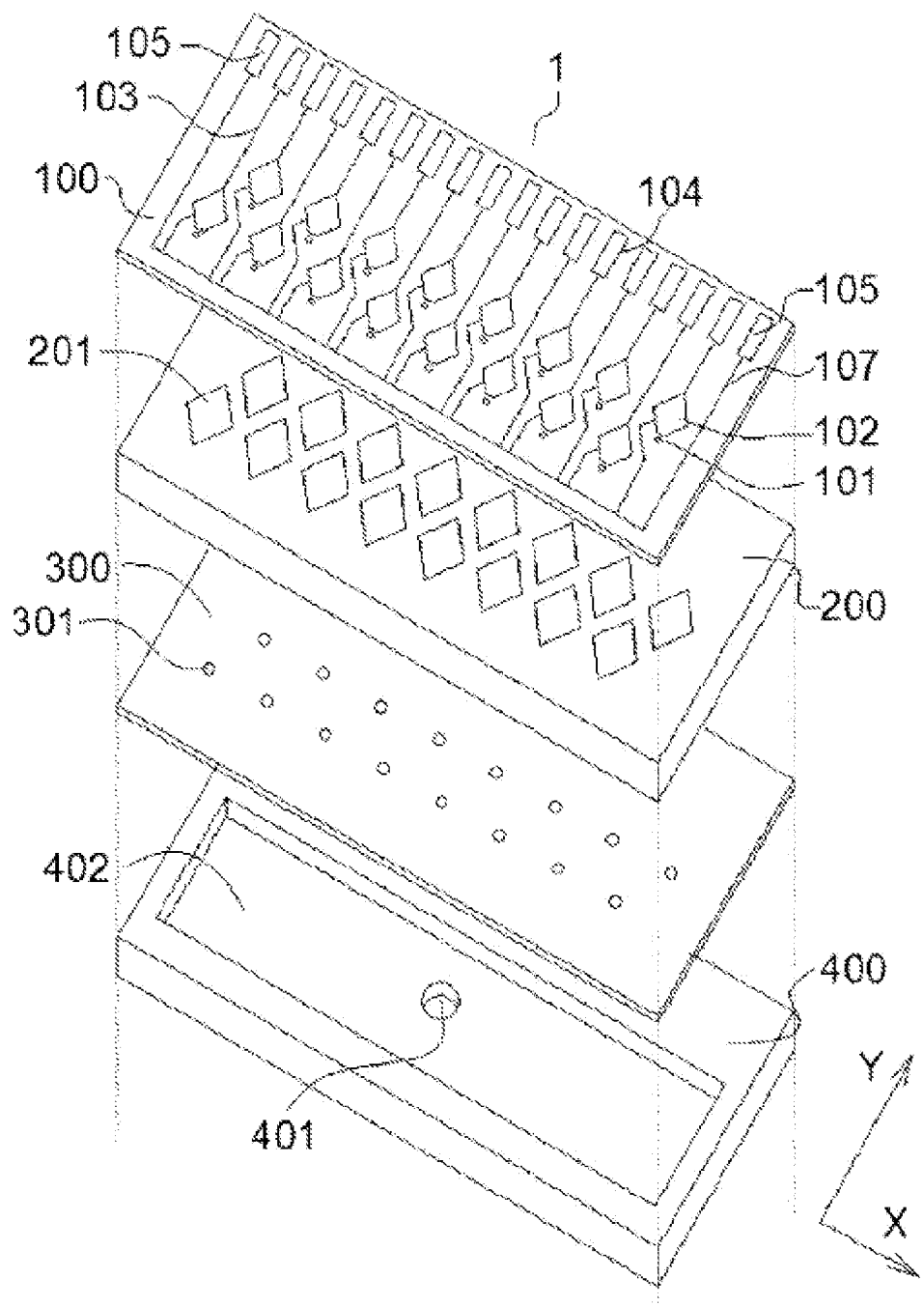
FIG. 21 is an exploded perspective view of an ink-jet head, according to a second embodiment.

FIG. 21 shows an exploded perspective view of the ink-jet head 1 according to a second embodiment. The second embodiment differs from the first embodiment in the geometric footprint of the ink pressure chamber 201 and the actuator 102. The second embodiment is configured to be the same for the other components.

The ink pressure chamber 201 and the actuator 102 form a rhombus. The actuator 102 is a rhombus with a width of 170 μm and a length of 340 μm. The diameter of the nozzle 101 is 20 μm, and the actuator 102 and the nozzle 101 are indifferent positions. The ink pressure chamber 201 surrounds the actuator 102 and the nozzle 101.

The nozzle 101 is connected to the ink pressure chamber 201 so that ink is discharged from the ink pressure chamber 201 via the nozzle. The nozzle 101 is formed on the outside of the region of the actuator 102, which includes the piezoelectric film, and is connected to the ink pressure chamber 201.

Compared to the circular piezoelectric film pattern, the rhomboid piezoelectric body pattern can be placed at a higher density.

Figure 22:
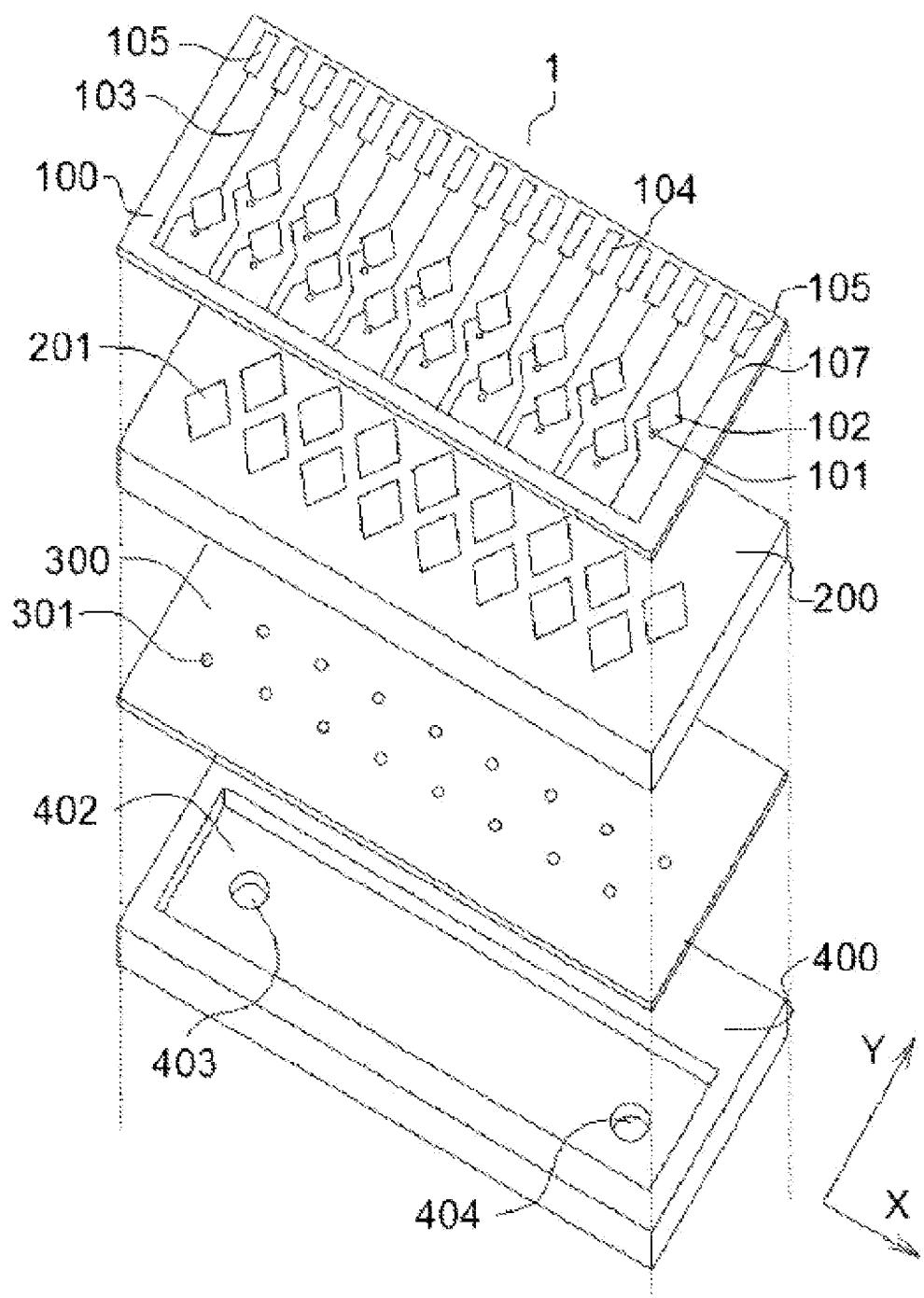
FIG. 22 is an exploded perspective view of the ink-jet head according to the second embodiment, showing a different example of an ink supply path from that depicted in FIG. 21.

FIG. 22, shows a configuration in which the circulating ink supply port 403 and a circulating ink discharge port 404 are positioned near the two ends of the ink supply path 402 so that ink will circulate in the ink supply path 402.

Third Embodiment

Figure 23:
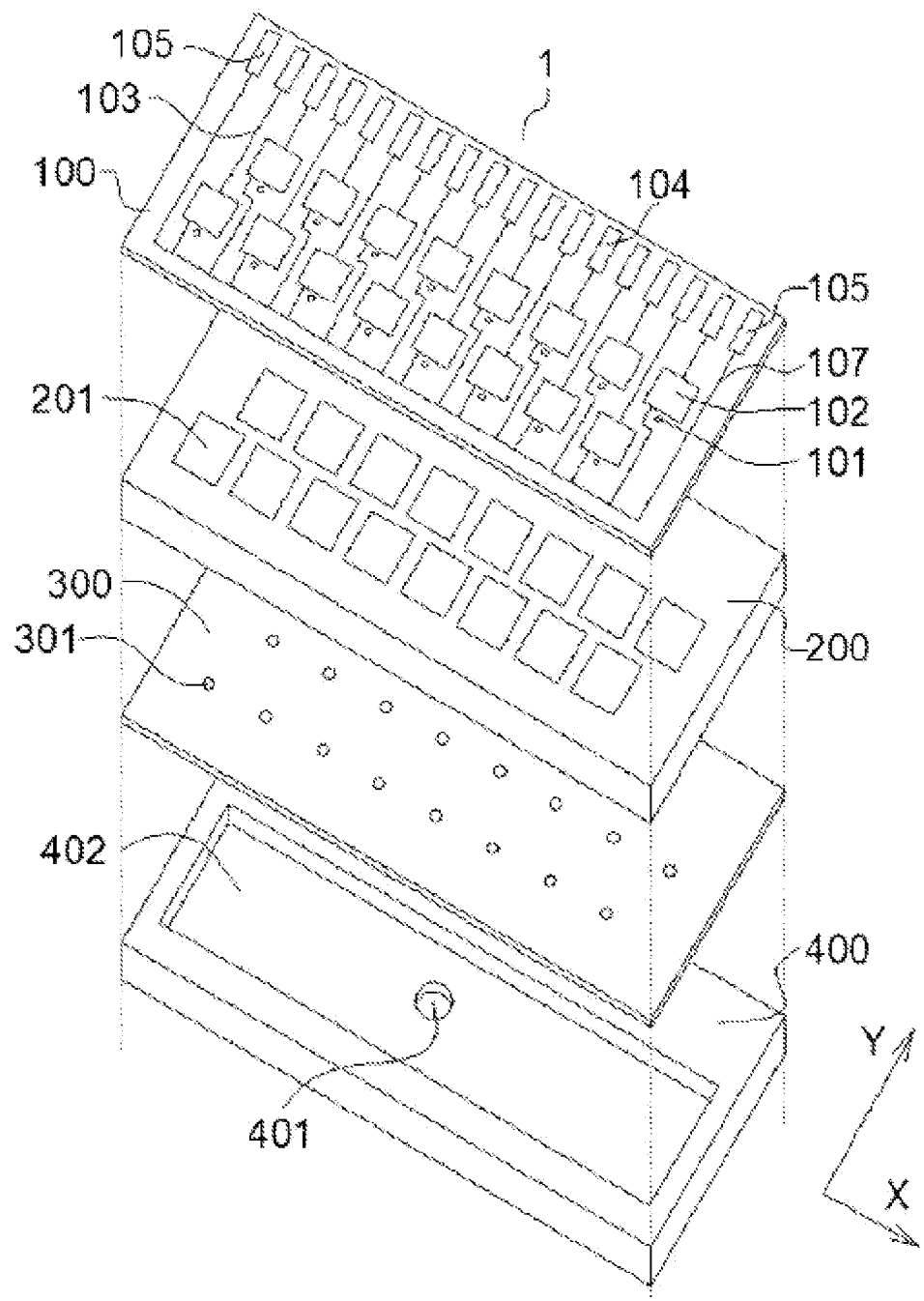
FIG. 23 is an exploded perspective view of an ink-jet head, according to a third embodiment.

FIG. 23 shows an exploded perspective view of the ink-jet head 1 according to a third embodiment. The third embodiment differs from the first embodiment in the geometric footprint of the ink pressure chamber 201 and the actuator 102. The third embodiment is configured to be the same for other components.

The ink pressure chamber 201 and the actuator 102 are rectangular. The actuator 102 is a rectangle with a width of 250 μm and a length of 220 μm. The diameter of the nozzle 101 is 20 μm, and the actuator 102 and the nozzle 101 are indifferent positions. Therefore, the nozzle 101 is formed on the outside of the region of the actuator 102, which includes the piezoelectric film, and is connected to the ink pressure chamber 201. The ink pressure chamber 201 surrounds the actuator 102 and the nozzle 101. Compared to the circular piezoelectric film pattern, since the actuator 102 has a larger surface area, it is possible to make the ink discharge pressure high.

Figure 24:
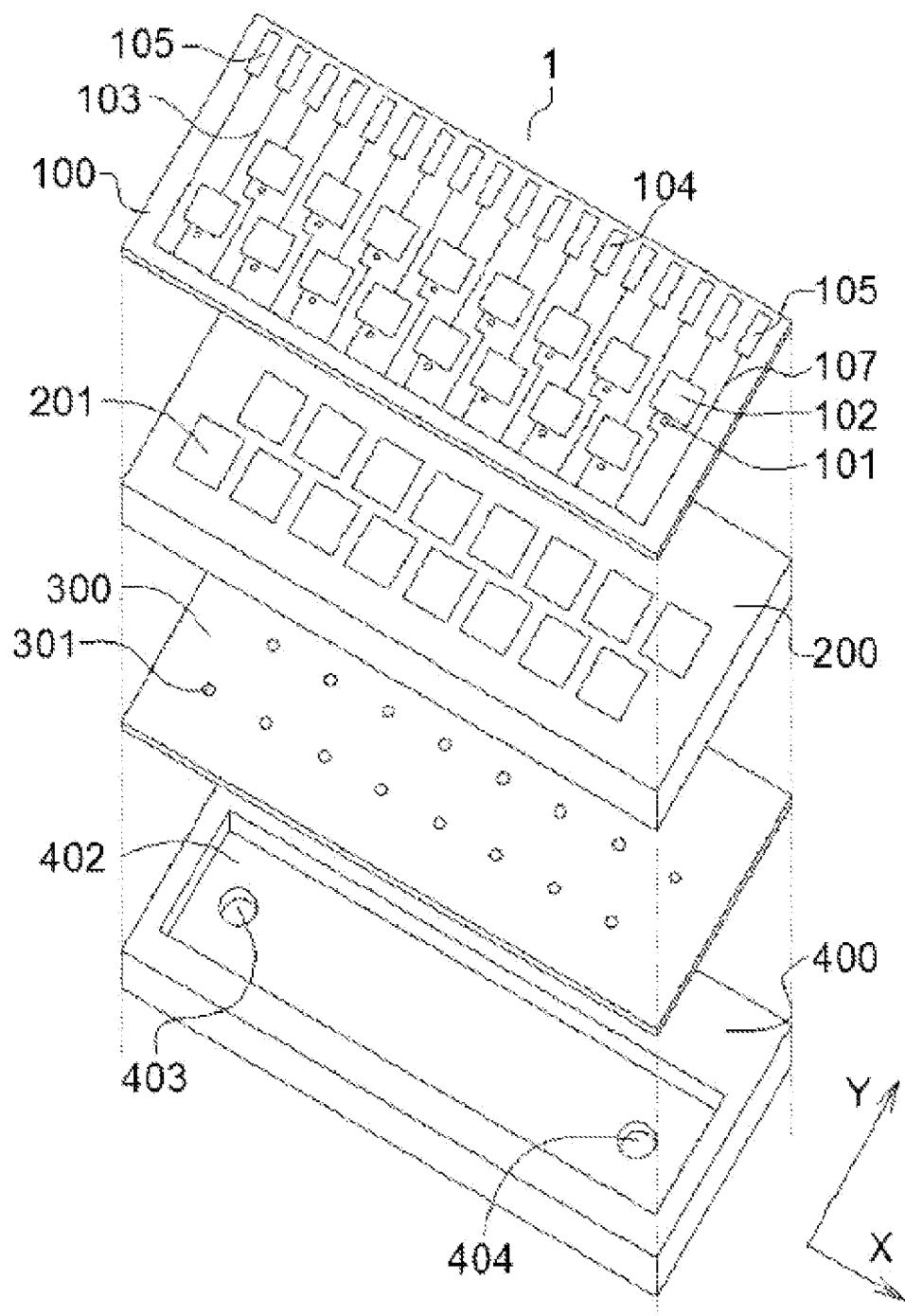
FIG. 24 is an exploded perspective view of the ink-jet head according to the third embodiment, showing a different example of an ink supply path from that depicted in FIG. 23.

FIG. 24 shows a configuration in which the circulating ink supply port 403 and a circulating ink discharge port 404 are positioned near the two ends of the ink supply path 402 so that ink will circulate in the ink supply path 402.

While certain embodiments have been described, these embodiments have been presented by way of example only, and they are not intended to limit the scope of the inventions. For example, in connection with the embodiments, specific dimensions and materials for components are identified; however such disclosure is not intended to be limiting. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An ink-jet head comprising:
   an oscillating plate having a nozzle configured to discharge ink;
   an ink pressure chamber in fluid communication with the nozzle and disposed on a first surface of the oscillating plate;
   a first electrode disposed on a second surface of the oscillating plate, the first electrode having a predetermined footprint;
   a piezoelectric film disposed on the first electrode at a position that does not overlap the nozzle and configured to expand or contract the ink pressure chamber by deforming the oscillating plate in response to a driving signal, the piezoelectric film having a footprint that is geometrically similar to the predetermined footprint;
   a second electrode that is formed on the piezoelectric film, the second electrode having a footprint that is geometrically similar to the predetermined footprint, wherein the first electrode and the second electrode are configured to provide the driving signal to the piezoelectric film;
   an ink supply path configured to supply ink to the ink pressure chamber;
   a protective film disposed on the second electrode; and
   an ink-repellent film disposed on the protective film.

2. The ink-jet head according to claim 1, wherein the ink-repellent film is formed on the protective film by spin coating a liquid ink-repelling film material on the protective film while positive air pressure is emitted from the nozzle.

3. The ink-jet head according to claim 1, wherein
   a Young's modulus of a material of the oscillating plate and a Young's modulus of a material of the protective film are different.

4. The ink-jet head according to claim 1, wherein:
   the at least one nozzle comprises multiple nozzles, and
   one of the first electrode and the second electrode comprises multiple independent electrodes each of which are configured to be electrically independent.

5. The ink-jet head according to claim 4, wherein
   each of the multiple independent electrodes comprise:
      an electrode terminal to which the driving signal is supplied from an external source,
      a wiring electrode connected to the electrode terminal, and
      an actuator wiring electrode formed on an end part of the wiring electrode and covering the piezoelectric film.

6. The ink-jet head according to claim 1, wherein the oscillating plate is formed from an insulating material.

7. The ink-jet head according to claim 1, wherein the protective film is formed from a resinous material.

8. The ink-jet head according to claim 1, further comprising:
   a wiring that is connected to the first electrode on the second surface of the oscillating plate, and that extends towards an edge of the oscillating plate, rounding about the nozzle.

9. The ink-jet head according to claim 1, wherein the ink-repellent film is comprised of at least one of a silicone material and a fluoride-containing organic material.

* * * * *